(12) United States Patent
Yang et al.

(10) Patent No.: US 11,656,495 B2
(45) Date of Patent: May 23, 2023

(54) DISPLAY MODULE AND METHOD OF MANUFACTURING THE SAME, DISPLAY APPARATUS, AND POLARIZER FOR DISPLAY MODULE

(71) Applicant: BOE TECHNOLOGY GROUP CO., LTD., Beijing (CN)

(72) Inventors: Xuekai Yang, Beijing (CN); Paoming Tsai, Beijing (CN); Xiongnan Zhang, Beijing (CN); Ce Xu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/485,615

(22) Filed: Sep. 27, 2021

(65) Prior Publication Data
US 2022/0100031 A1  Mar. 31, 2022
US 2022/0100031 A1  Mar. 31, 2022

(30) Foreign Application Priority Data

Sep. 28, 2020 (CN) .......................... 202011038671.9

(51) Int. Cl.
*G02F 1/1335* (2006.01)
*G02F 1/1333* (2006.01)

(52) U.S. Cl.
CPC .... *G02F 1/133528* (2013.01); *G02F 1/13338* (2013.01); *G02F 1/133331* (2021.01); *G02F 1/133385* (2013.01); *G02F 2202/28* (2013.01)

(58) Field of Classification Search
CPC ......... G02F 1/133385; G02F 1/133509; G02F 1/133567; G02F 1/133562; G02F 1/1335; G02F 2202/28; G02F 1/13338; G02F 1/133331; G02F 1/133528; H01L 27/323; G02B 5/30

See application file for complete search history.

(56) References Cited

U.S. PATENT DOCUMENTS

2002/0125803 A1* 9/2002 Seki ...................... H01J 29/006
                                                                 349/161
2012/0320314 A1* 12/2012 Lin ..................... G02F 1/133528
                                                                 349/96

(Continued)

FOREIGN PATENT DOCUMENTS

| CN | 204390199 | 6/2015 |
| CN | 111381704 | 7/2020 |
| JP | H09159824 | 6/1997 |

OTHER PUBLICATIONS

Chinese Office Action (w/ English translation) for corresponding Chinese Application No. 202011038671.9, dated Apr. 18, 2022, 20 pages.

*Primary Examiner* — Mariam Qureshi
(74) *Attorney, Agent, or Firm* — Dority & Manning, P.A.

(57) ABSTRACT

The embodiments of the present disclosure provide a display module and a method of manufacturing the same, a display apparatus, and a polarizer for a display module. The display module includes a display panel and a component to be bonded. The display panel has a light exit surface and a back surface that are opposite to each other. The component to be bonded includes a layer to be bonded and at least one thermal adhesive film. The at least one thermal adhesive film is fixed to one of the light exit surface and the back surface of the display panel.

10 Claims, 12 Drawing Sheets

(56) References Cited

U.S. PATENT DOCUMENTS

| | | | |
|---|---|---|---|
| 2015/0036208 A1* | 2/2015 | Umeya | G02F 1/167 |
| | | | 156/146 |
| 2015/0153862 A1* | 6/2015 | Nakamura | G06F 1/1626 |
| | | | 345/173 |
| 2016/0202842 A1* | 7/2016 | Uriu | G06F 3/0445 |
| | | | 345/175 |
| 2019/0196264 A1 | 6/2019 | Mai | |
| 2019/0286259 A1 | 9/2019 | Lin | |

* cited by examiner

1'

(a)

(b)

(a)

(b)

(c)

DISPLAY MODULE AND METHOD OF MANUFACTURING THE SAME, DISPLAY APPARATUS, AND POLARIZER FOR DISPLAY MODULE

CROSS-REFERENCE TO RELATED APPLICATION

This application claims priority to Chinese Patent Application No. 202011038671.9, filed on Sep. 28, 2020, which is incorporated herein by reference in its entirety.

TECHNICAL FIELD

The present disclosure relates to the field of display technologies, and in particular, to a display module and a method of manufacturing the same, a display apparatus, and a polarizer for a display module.

BACKGROUND

With the development of technology and economy, users' requirements for volumes and thicknesses of electronic products become higher and higher. Lightness, thinness and portability are a necessary development trend of electronic products. For electronic products such as mobile phones and tablet computers, a thickness of a display module has a vital effect on a thickness of an electronic product. It is of great significance to reduce the thickness of the display module.

SUMMARY

In a first aspect, a display module is provided, including: a display panel and a component to be bonded. The display panel has a light exit surface and a back surface that are opposite to each other. The component to be bonded includes a layer to be bonded and at least one thermal adhesive film. The at least one thermal adhesive film is fixed to one of the light exit surface and the back surface of the display panel.

In some embodiments, the component to be bonded is a polarizer. The at least one thermal adhesive film includes a first thermal adhesive film. The layer to be bonded includes a polarizing functional layer disposed on a side of the first thermal adhesive film away from the display panel.

In some embodiments, the at least one thermal adhesive film further includes a second thermal adhesive film disposed on a side of the polarizing functional layer away from the first thermal adhesive film.

In some embodiments, the polarizer is disposed on the light exit surface of the display panel. The display module further includes a cover plate disposed on a side of the polarizer away from the display panel, and the cover plate is bonded to the display panel through the second thermal adhesive film.

In some embodiments, the first thermal adhesive film is bonded to the display panel.

In some embodiments, the component to be bonded is a polarizer. The at least one thermal adhesive film includes a second thermal adhesive film. The layer to be bonded includes a polarizing functional layer disposed on a side of the second thermal adhesive film proximate to the display panel. The display module further includes a first adhesive layer disposed on a side of the polarizing functional layer proximate to the display panel, and the first adhesive layer is bonded to the display panel.

In some embodiments, the polarizer is disposed on the light exit surface of the display panel. The display module further includes a cover plate disposed on a side of the polarizer away from the display panel. The cover plate is bonded to the display panel through the second thermal adhesive film.

In some embodiments, the display panel includes a touch circuit layer integrated therein.

In some embodiments, the component to be bonded is a touch structure. The at least one thermal adhesive film includes a third thermal adhesive film disposed on the light exit surface of the display panel. The layer to be bonded includes a touch circuit layer disposed on a side of the third thermal adhesive film away from the display panel.

In some embodiments, the third thermal adhesive film is bonded to the display panel.

In some embodiments, the component to be bonded is a heat radiating structure. The at least one thermal adhesive film includes a fourth thermal adhesive film disposed on the back surface of the display panel. The layer to be bonded includes a heat radiating plate disposed on a side of the fourth thermal adhesive film away from the display panel, the fourth thermal adhesive film is bonded to the display panel.

In some embodiments, the heat radiating plate includes a buffer layer, a support layer, and a heat radiating layer that are sequentially stacked. The buffer layer is bonded to the fourth thermal adhesive film, or the component to be bonded further includes a second adhesive layer, and the buffer layer is bonded to the fourth thermal adhesive film through the second adhesive layer.

In some embodiments, any of the at least one thermal adhesive film is made of polyamide, polyurethane, polyester fiber, polyolefin, cycloolefin copolymer (COC) or cycloolefin polymer (COP).

In some embodiments, a thickness of any of the at least one thermal adhesive film is within a range of 10 μm to 150 μm, inclusive.

In a second aspect, a display apparatus is provided, and the display apparatus includes the display module described in any of the above embodiments.

In a third aspect, a polarizer for a display module is provided. The polarizer includes a polarizing functional layer and at least one thermal adhesive film, each thermal adhesive film is fixed to a surface of the polarizing functional layer.

In some embodiments, the polarizing functional layer has a first surface and a second surface in a thickness direction of the polarizing functional layer. The at least one thermal adhesive film includes a first thermal adhesive film and a second thermal adhesive film. The first thermal adhesive film is disposed on the first surface of the polarizing functional layer, and the second thermal adhesive film is disposed on the second surface of the polarizing functional layer.

In a fourth aspect, a method of manufacturing a display module is provided. The method includes: providing a display panel, the display panel having a light exit surface and a back surface that are opposite to each other; providing a component to be bonded including a layer to be bonded and a first thermal adhesive film; and fixedly the component to be bonded on one of the light exit surface and the back surface of the display panel, the first thermal adhesive film being closer to the display panel than the layer to be bonded; performing a hot pressing process, so that the first thermal adhesive film is bonded to the display panel.

In some embodiments, the component to be bonded includes the layer to be bonded, the first thermal adhesive film and a second thermal adhesive film, the second thermal adhesive film is farther away from the display panel than the layer to be bonded. The method further includes: fixing a cover plate on the second thermal adhesive film, so that the cover plate is bonded to the second thermal adhesive film during the hot pressing process.

In some embodiments, an operating temperature of the hot pressing process is within a range of 60° C. to 300° C., inclusive, and pressure of the hot pressing process is within a range of 0.1 MPa to 20 MPa, inclusive, or a range of 0.1 MPa to 40 MPa, inclusive.

BRIEF DESCRIPTION OF THE DRAWINGS

In order to describe technical solutions in the present disclosure more clearly, the accompanying drawings to be used in some embodiments of the present disclosure will be introduced briefly below. However, the accompanying drawings to be described below are merely accompanying drawings of some embodiments of the present disclosure, and a person of ordinary skill in the art can obtain other drawings according to these drawings. In addition, the accompanying drawings in the following description may be regarded as schematic diagrams, and are not limitations on actual sizes of products, actual processes of methods and actual timings of signals to which the embodiments of the present disclosure relate.

DETAILED DESCRIPTION

Figure 1:
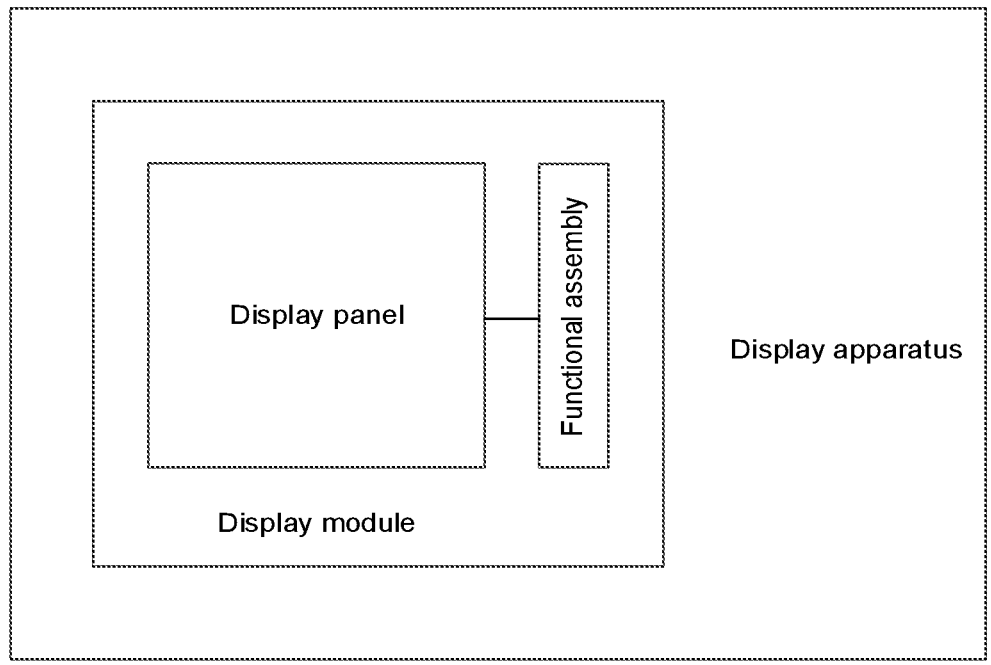
FIG. 1 is a diagram showing a structure of a display apparatus, in accordance with some embodiments of the present disclosure.

Technical solutions in some embodiments of the present disclosure will be described clearly and completely with reference to the accompanying drawings below. However, the described embodiments are merely some but not all embodiments of the present disclosure. All other embodiments obtained by a person of ordinary skill in the art on a basis of the embodiments of the present disclosure shall be included in the protection scope of the present disclosure.

Unless the context requires otherwise, throughout the description and the claims, the term "comprise" and other forms thereof such as the third-person singular form "comprises" and the present participle form "comprising" are construed as an open and inclusive meaning, i.e., "including, but not limited to." In the description of the specification, the terms such as "one embodiment," "some embodiments," "exemplary embodiments," "example," "specific example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials, or characteristics may be included in any one or more embodiments or examples in any suitable manner.

Hereinafter, the terms such as "first" and "second" are only used for descriptive purposes, and are not to be construed as indicating or implying the relative importance or implicitly indicating the number of indicated technical features. Thus, features defined by "first" or "second" may explicitly or implicitly include one or more of the features. In the description of the embodiments of the present disclosure, the term "a plurality of", "the plurality of", or "multiple" means two or more unless otherwise specified.

In the description of some embodiments, the terms such as "coupled" and "connected" and their derivatives may be used. For example, the term "connected" may be used in the description of some embodiments to indicate that two or more components are in direct physical contact or electrical contact with each other. As another example, the term "coupled" may be used in the description of some embodiments to indicate that two or more components are in direct physical or electrical contact. However, the term "coupled" or "communicatively coupled" may also mean that two or more components are not in direct contact with each other, but still cooperate or interact with each other. The embodiments disclosed herein are not necessarily limited to the contents herein.

The phrase "at least one of A, B and C" has a same meaning as the phrase "at least one of A, B or C", and they both include the following combinations of A, B and C: only A, only B, only C, a combination of A and B, a combination of A and C, a combination of B and C, and a combination of A, B and C.

The phrase "A and/or B" includes the following three combinations: only A, only B, and a combination of A and B.

As used herein, the term "if" is, optionally, construed as "when" or "in a case where" or "in response to determining that" or "in response to detecting", depending on the context. Similarly, the phrase "if it is determined" or "if [a stated condition or event] is detected" is, optionally, construed as "in a case where it is determined that" or "in response to determining that" or "in a case where [the stated condition or event] is detected" or "in response to detecting [the stated condition or event]", depending on the context.

The use of the phrase "applicable to" or "configured to" herein means an open and inclusive language, which does not exclude devices that are applicable to or configured to perform additional tasks or steps.

In addition, the use of the phrase "based on" means openness and inclusiveness, since a process, step, calculation or other action that is "based on" one or more of the stated conditions or values may, in practice, be based on additional conditions or values exceeding those stated.

Exemplary embodiments are described herein with reference to cross-sectional views and/or plan views as idealized exemplary drawings. In the accompanying drawings, thicknesses of layers and sizes of regions are enlarged for clarity. Therefore, variations in shape with respect to the accompanying drawings due to, for example, manufacturing technologies and/or tolerances may be envisaged. Therefore, the exemplary embodiments should not be construed to be limited to shapes of the regions shown herein, but to include deviations in shape due to, for example, manufacturing. For example, an etched region shown in a rectangular shape generally has a curved feature. Therefore, the regions shown in the accompanying drawings are schematic in nature, and their shapes are not intended to show actual shapes of the regions in a device, and are not intended to limit the scope of the exemplary embodiments.

In the embodiments of the present disclosure, A being located on B can be understood that B is a carrier of A. Or it can be understood that, according to an order of preparation of layers, B is formed first, and A is formed later. It is not limited to that A is located above B in space. If a placing angle of a device is rotated, although A is not above B in space, A is still carried by B, that is, A is still located on B.

It will be understood that when a layer or element is referred to as being "on" another layer or substrate, it can be directly on the another layer or substrate, or intervening layers may also be present.

With the continuous improvement of living standards, users have higher and higher requirements for volumes and thicknesses of electronic products while their demand for electronic products increases. A display module is an indispensable component of an electronic product, and a thickness thereof has a great effect on an overall thickness of the electronic product.

In order to reduce the overall thickness of the electronic product, embodiments of the present disclosure provide a display apparatus. The display apparatus refers to an electronic product with an image display function. The display apparatus may be a display, a television, a billboard, a digital photo frame, a laser printer with a display function, a telephone, a mobile phone, a personal digital assistant (PDA), a digital camera, a portable camcorder, a viewfinder, a monitor, a navigator, a vehicle, a large-area wall, a home appliance, an information query equipment (e.g., a business query equipment for a sector such as e-government, banks, hospitals, and electric power), a car rear-view mirror, a dressing mirror, etc.

Referring to FIG. 1, the display apparatus includes a display module, and the display module refers to a modular assembly assembled from a display panel and related functional components. The functional components may include at least one of an electronic element (e.g., a driver chip), a flexible circuit board and the like that are coupled to the display panel. The functional components may further include a functional layer (i.e., a layer that can play a certain role) located on a side of the display panel. For example, the functional layer may be any of a polarizing functional layer, a touch circuit layer, a cover plate, a backplane (also referred to as a back film), or a heat radiating plate that are located on the side of the display panel. In addition, the display apparatus may further include a housing for fixing and protecting the display panel and the functional components, and a power supply system for supplying power to the display module.

Some embodiments of the present disclosure provide a display module. Referring to FIGS. 2A to 2E, the display module 1 includes a display panel 10. The display panel 10 is used to display images (i.e., pictures), and has a light exit surface and a back surface that are opposite to each other. The light exit surface of the display panel 10 refers to a surface of the display panel 10 where an image may be viewed. The back surface of the display panel 10 refers to a surface of the display panel 10 where the image cannot be viewed, i.e., a surface facing away from the light exit surface.

The display panel 10 may be, for example, a liquid crystal display (LCD) display panel, an organic light-emitting diode (OLED) display panel, a quantum dot light-emitting diode (QLED) display panel, a micro LED (including mini LED or micro LED) display panel, etc.

Figure 3A:
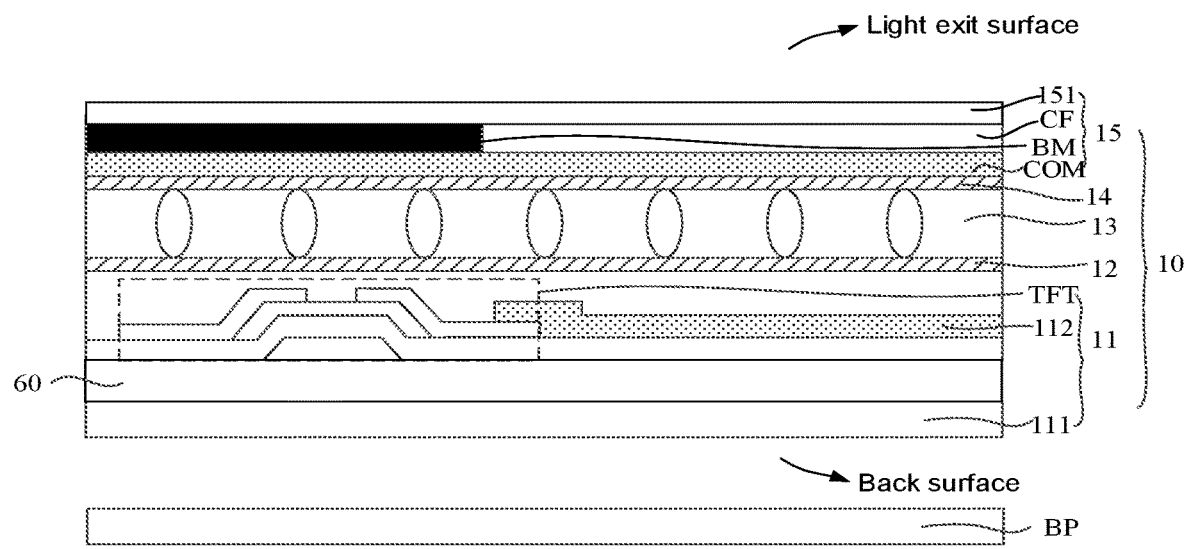
FIG. 3A is a diagram showing a structure of a display panel in a display module, in accordance with some embodiments of the present disclosure.

In some examples, referring to FIG. 3A, the display panel 10 is the LCD display panel, and the display panel 10 includes an array substrate 11, a liquid crystal layer 13, and a counter substrate 15 that are sequentially arranged. The array substrate 11 may include, for example, a first base 111, a transistor (e.g., a thin film transistor TFT) disposed on the first base 111, and a pixel electrode 112 coupled to the transistor. The counter substrate 15 may include a second base 151. For example, the counter substrate 15 may further include a color film (also referred to as a color filter (CF)) and a black matrix BM that are disposed on the second base 151. As another example, the color film CF and the black matrix BM may also be disposed on the first base 111, that is, they are integrated in the array substrate 11. The display panel 10 may further include a common electrode COM. For example, the common electrode COM may be disposed on the second base 151, that is, it is integrated in the counter substrate 15. As another example, the common electrode COM may be disposed on the first base 111, that is, it is integrated in the array substrate 11. In addition, the display panel 10 may further include a first alignment film 12 disposed between the array substrate 11 and the liquid crystal layer 13, and a second alignment film 14 disposed between the counter substrate 15 and the liquid crystal layer 13.

In this case, the display module 1 may further include a backlight source BP. The light exit surface of the display panel 10 may be a surface of the display panel 10 away from the backlight source BP. The back surface of the display panel 10 may be a surface of the display panel 10 proximate to the backlight source BP.

In some examples, with continued reference to FIG. 3A, a touch circuit layer 60 is integrated in the display panel 10. The display panel 10 including the touch circuit layer 60 may be referred to as a touch display panel. For example, the display panel 10 is the LCD display panel, and the touch circuit layer 60 may be located between the first base 111 and the second base 151. For example, the touch circuit layer 60 may be located between the pixel electrode 112 and the first base 111. As another example, the touch circuit layer 60 may also be located between the second alignment film 14 and the second base 151. It will be noted that, in a case where the touch circuit layer 60 is integrated in the display panel 10, there is no need to provide the touch circuit layer outside the display panel.

Figure 3B:
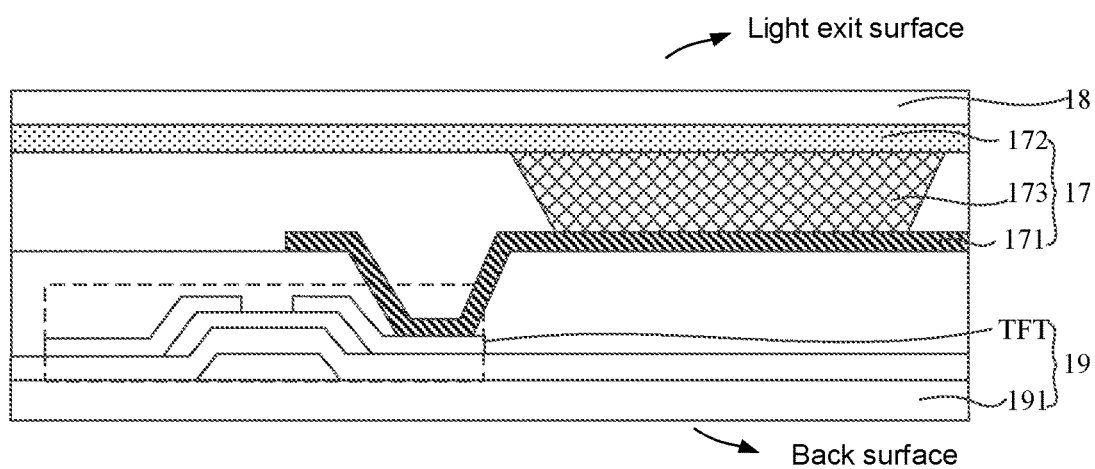
FIG. 3B is a diagram showing a structure of another display panel in a display module, in accordance with some embodiments of the present disclosure.

In some other examples, referring to FIG. 3B, the display panel 10 is an OLED display panel. The display panel 10 includes a driving backplane 19, a light-emitting layer 17, and an encapsulation layer 18 that are sequentially arranged. The driving backplane 19 includes a base (also referred to as a base substrate or substrate) 191 and a driving circuit layer disposed on the base 191. The driving circuit layer includes a plurality of pixel driving circuits. For example, one pixel driving circuit (e.g., each of the plurality of pixel driving circuits) includes a plurality of transistors (e.g., thin film transistors TFT). The light-emitting layer 17 includes a plurality of light-emitting devices. One light-emitting device is coupled to one pixel driving circuit. For example, one light-emitting device may include a first electrode 171, a second electrode 172, and a light-emitting functional layer 173 located between the first electrode 171 and the second electrode 172. In a case where the light-emitting devices are OLEDs, the light-emitting layer 17 may be referred to as an organic light-emitting layer.

For a top-emission display panel 10, the light exit surface of the display panel 10 may be a surface (which is the upper surface of the display panel 10 in FIG. 3B) of the encapsulation layer 18 away from the base 191, and the back surface of the display panel 10 may be a surface (which is the bottom surface of the display panel 10 in FIG. 3B) of the base 191 away from the encapsulation layer 18. For a bottom-emission display panel 10, the light exit surface of the display panel 10 may be the surface of the base 191 away from the encapsulation layer 18, and the back surface of the display panel 10 may be the surface of the encapsulation layer 18 away from the base 191. In some examples, the touch circuit layer may be integrated in the OLED display panel, and the OLED display panel including the touch circuit layer may be referred to as a touch display panel. For example, the touch circuit layer may be located between the encapsulation layer 18 and the base 191, for example, the touch circuit layer may be disposed between the light-emitting layer 17 and the base 191. It will be noted that, in a case where the touch circuit layer is integrated in the OLED display panel, there is no need to provide the touch circuit layer outside the OLED display panel.

With continued reference to FIGS. 2A to 2F, the display module 1 may further include a component 2 to be bonded, and the component 2 to be bonded includes a layer 200 to be bonded and at least one thermal adhesive film 20 (i.e., one or more thermal adhesive films 20). The at least one thermal adhesive film 20 is fixed to the light exit surface or the back surface of the display panel 10. The at least one thermal adhesive film 20 may be all thermal adhesive films included in the display module 1 or part of thermal adhesive films in the display module 1. In addition, the at least one thermal adhesive film 20 located on the light exit surface or the back surface of the display panel 10 may be in contact with the display panel 10, or not in contact with the display panel 10.

Figure 2A:
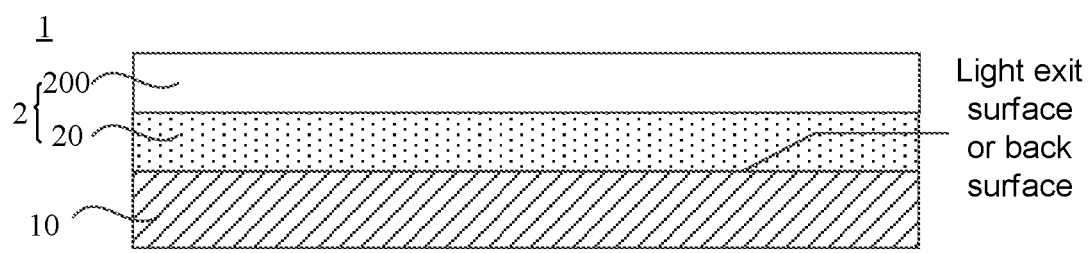
FIGS. 2A to 2F are diagrams showing laminated structures of some display modules, in accordance with some embodiments of the present disclosure.

In an example, referring to FIG. 2A, a thermal adhesive film 20 is directly bonded to the display panel 10. For example, they may be hot pressed together, so that the thermal adhesive film 20 may be in direct contact with the light exit surface or the back surface of the display panel 10. In this case, the layer 200 to be bonded is located on a side of the thermal adhesive film 20 away from the display panel 10.

Figure 2B:
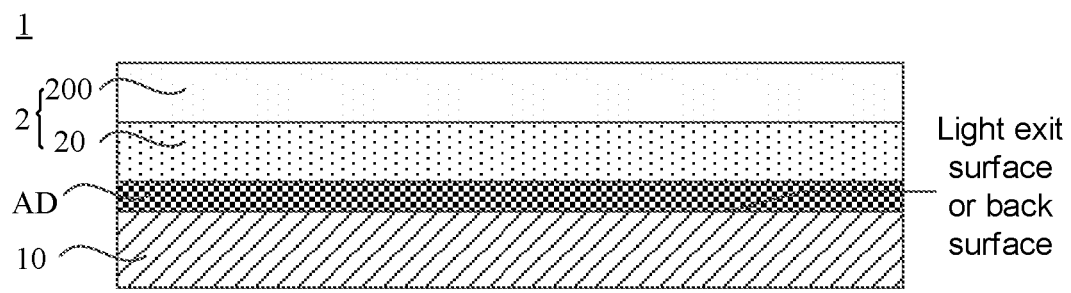

In another example, referring to FIG. 2B, an adhesive layer AD is disposed on a surface of a thermal adhesive film 20 proximate to the display panel 10. The thermal adhesive film 20 is bonded to the light exit surface or the back surface of the display panel 10 through the adhesive layer AD. In this case, the thermal adhesive film 20 may be hot pressed together with a functional layer or a base material layer (also referred to as a substrate) carrying the functional layer located on a side of the thermal adhesive film 20 away from the display panel 10, and the functional layer or the base material layer carrying the functional layer is the layer 200 to be bonded.

Figure 2C:
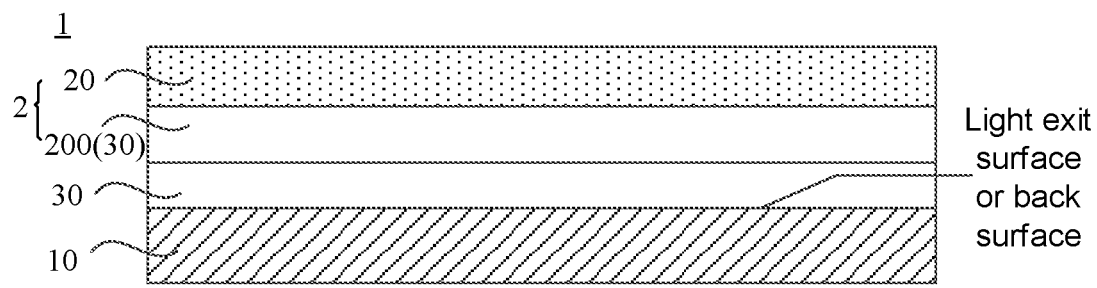
Figure 2D:
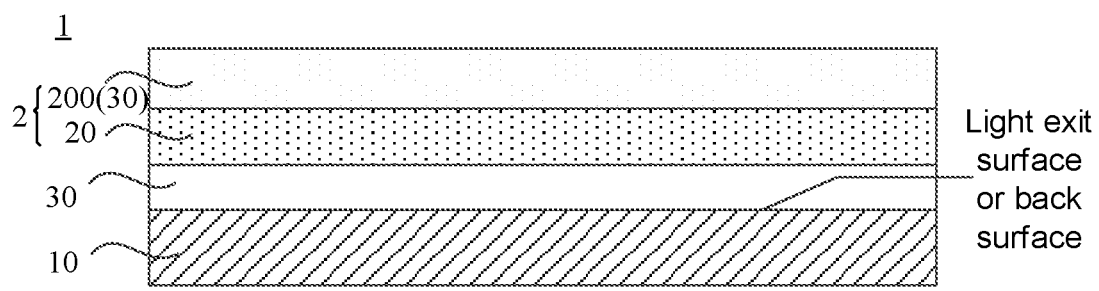

In yet another example, referring to FIGS. 2C and 2D, the display module 1 further includes at least one functional layer 30 (i.e., one or more functional layers 30) located between a thermal adhesive film 20 and the display panel 10. The at least one functional layers 30 is fixed to the light exit surface or the back surface of the display panel 10. Each functional layer 30 may be of a single-layer or multi-layer structure. For example, the functional layer 30 may be the touch circuit layer or the polarizing functional layer. In addition, the at least one functional layer 30 between the thermal adhesive film 20 and the display panel 10 is not limited to only one type. For example, the touch circuit layer and the polarizing functional layer may be disposed between the thermal adhesive film 20 and the display panel 10 simultaneously. Among these functional layers 30, a functional layer 30 closest to the display panel 10 may be in direct contact with the display panel 10, for example, it may be directly formed on the display panel 10. The thermal adhesive film 20 may be in direct contact with another functional layer 30 (i.e., a functional layer 30 among the at least one functional layer 30 that is closest to the thermal adhesive film 20) or a base material layer (not shown in the figure) carrying a functional layer 30. For example, referring to FIG. 2C, the another functional layer 30 or the base material layer carrying the functional layer 30 and the thermal adhesive film 20 may be hot pressed together, and the another functional layer 30 or the base material layer carrying the functional layer 30 is the layer 200 to be bonded. As another example, the functional layer 30 is formed on the thermal adhesive film 20, in this case, the thermal adhesive film 20 is used as the base material layer of the functional layer 30, referring to FIG. 2D, the thermal adhesive film 20 may be hot pressed together with another functional layer or another base material layer carrying the another functional layer located on a side of the thermal adhesive film 20 away from the display panel 10, and the another functional layer 30 or the another base material layer carrying the another functional layer 30 is the layer 200 to be bonded.

Figure 2E:
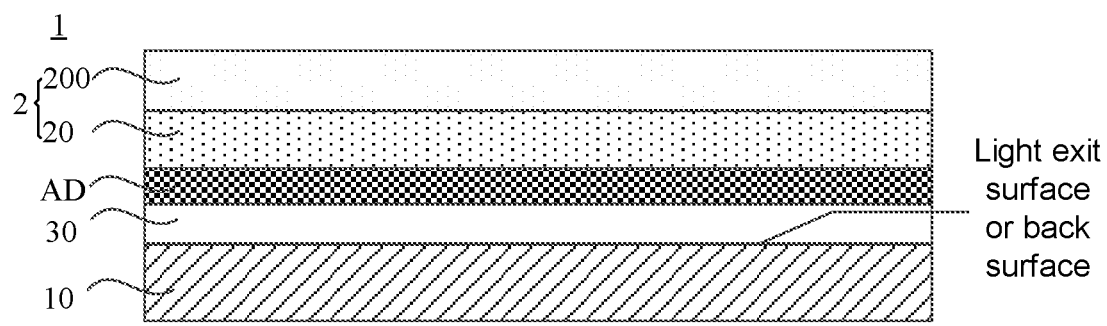

In yet another example, referring to FIG. 2E, the display module 1 includes at least one functional layer 30 (i.e., one or more functional layers 30) located between a thermal adhesive film 20 and the display panel 10. The at least one functional layer 30 is fixedly disposed on the light exit surface or the back surface of the display panel 10. For composition of the at least one functional layers 30, reference may be made to the description in the corresponding example in FIG. 2C. The display module 1 further includes an adhesive layer AD located between the at least one functional layer 30 and the thermal adhesive film 20, so that the thermal adhesive film 20 is bonded to a functional layer 30 (i.e., a functional layer 30 among the at least one functional layer 30 that is closest to the thermal adhesive film 20) or a base material layer carrying the functional layer 30 through the adhesive layer AD. In this case, the thermal adhesive film 20 may be hot pressed together with another functional layer or a base material layer carrying the another functional layer located on the side of the thermal adhesive film 20 away from the display panel 10, and the another functional layer 30 or the base material layer carrying the another functional layer 30 is the layer 200 to be bonded.

Figure 2F:
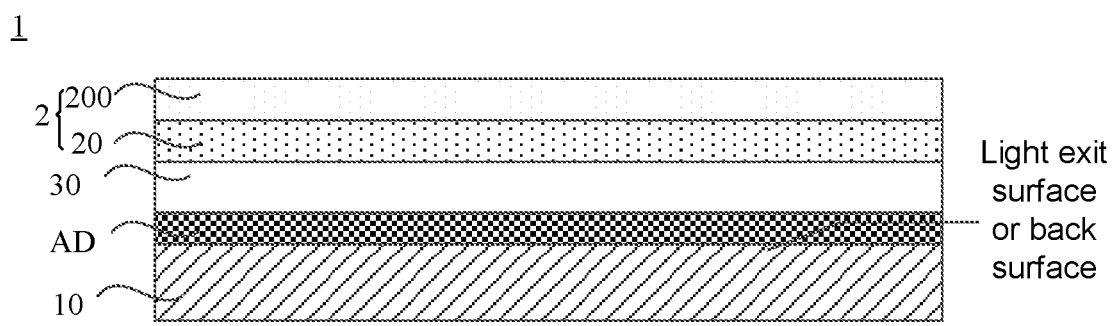

In yet another example, referring to FIG. 2F, the display module 1 further includes at least one functional layer 30 (i.e., one or more functional layers 30) located between a thermal adhesive film 20 and the display panel 10. For composition of the at least one functional layer 30 and relationships between the at least one functional layers 30 and the thermal adhesive film 20, reference may be made to the description in the corresponding example in FIG. 2C. A difference from FIG. 2C is in that a functional layer 30 among these functional layers 30 that is closest to the display panel 10 or the base material layer carrying the functional layer 30 may be bonded to the light exit surface or the back surface of the display panel 10 through the adhesive layer AD.

In the above examples, a material of the adhesive layer AD may be a pressure sensitive adhesive (PSA), an optically clear adhesive (OCA), etc. The optically clear adhesive has characteristics of colorlessness and transparency, a light transmittance of more than 90%, good bonding strength, capability of being cured at room temperature, small curing shrinkage and the like, and is suitable to apply to the display module.

In a first environment, the thermal adhesive film 20 is softened and becomes sticky, and may be bonded to a component located on at least one side of the thermal adhesive film 20 (e.g., the functional layer, the base material layer carrying the functional layer or the display panel located on a side of the thermal adhesive film 20). The first environment is a high-temperature environment, i.e., an environment with a temperature of over 60° C., for example, a range of 60° C. to 300° C., inclusive, for example, 70° C., 90° C., 100° C., 120° C., or 200° C. Or, the first environment is an environment with a high temperature and certain pressure. The temperature may be over 60° C., and reference may be made to the above introduction for details. The pressure is within a range of 0.1 MPa to 20 MPa, inclusive, for example, 0.1 MPa, 1 Mpa, 5 Mpa, or 8 Mpa. After returning to a second environment, the thermal adhesive film 20 is hardened (or cured), and may be firmly bonded to the component located on the at least one side of the thermal adhesive film 20 for support and protection. In this case, the thermal adhesive film may maintain a shape of a thin film without a base material. The second environment may be a normal environment (i.e., at room temperature, for example, 23±3° C. (i.e., 20 to 26° C.)), or may be below room temperature, for example, below 0° C.

In some embodiments, an adhesive force between the thermal adhesive film 20 and a component in the first environment (e.g., at 60° C.) is greater than an adhesive force between the thermal adhesive film 20 and the same component in the second environment. For example, the former may be more than 2 times larger than the latter, such as, more than 5 times, 10 times, 20 times, or 80 times. For example, the component may be a base included in the display panel, such as a PI substrate, a PET substrate, or a glass substrate. In addition, the thermal adhesive film 20 may have a high tensile storage elastic modulus in the second environment, for example, more than $1.00 \times 10^6$ Pa, or even more than $1.00 \times 10^8$ Pa.

In order to describe the solutions more clearly, two components adjacent and bonded to each other in the display module may be referred to as a first member to be bonded and a second member to be bonded. At least one of the first member to be bonded and the second member to be bonded includes the thermal adhesive film, so that the first member to be bonded and the second member to be bonded can be bonded together by a hot pressing process. For example, the first member to be bonded includes the display panel and the thermal adhesive film. The second member to be bonded may be, for example, the cover plate or the heat radiating plate. A bonding process of the two may include: firstly making the second member to be bonded in contact with a surface of the thermal adhesive film in the first member to be bonded, and then performing hot pressing. During the hot pressing process, the thermal adhesive film is softened and becomes sticky, and when it is cooled to room temperature or a low temperature, the thermal adhesive film in the first member to be bonded is bonded to the second member to be bonded, so that the first member to be bonded and the second member to be bonded are no longer separated. As another example, the first member to be bonded includes the display panel or the display panel on which the functional layer is fixedly disposed. The second member to be bonded includes the thermal adhesive film. The bonding process of the two may include: firstly making a surface of the thermal adhesive film in the second member to be bonded in contact with the first member to be bonded, and then performing hot pressing. During the hot pressing process, the thermal adhesive film is softened and becomes sticky, and when it is cooled to room temperature or a low temperature, the first member to be bonded is bonded to the thermal adhesive film in the second member to be bonded, so that the first member to be bonded and the second member to be bonded are no longer separated.

Figure 4A:
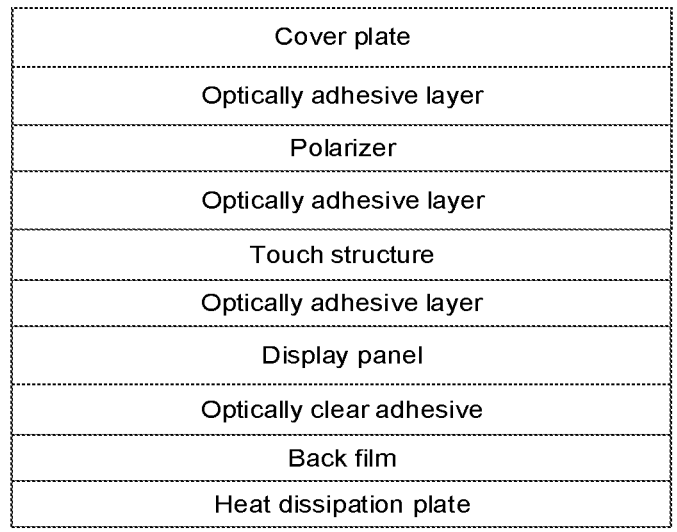
FIG. 4A is a diagram showing a laminated structure of a display module in the related art.
Figure 4B:
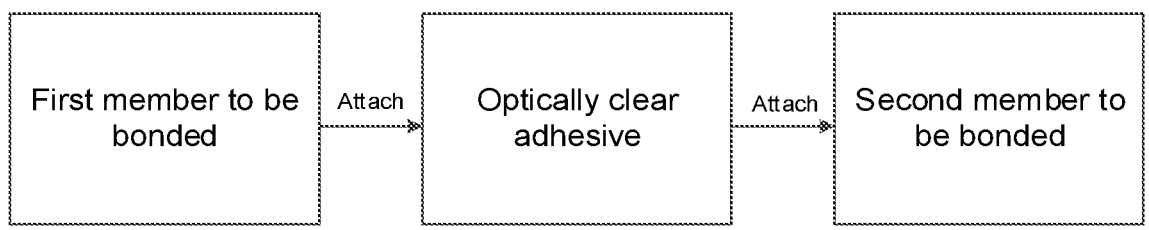
FIG. 4B is a diagram comparing a process of a display module in accordance with some embodiments of the present disclosure and a process of a display module in the related art.
Figure 4B:
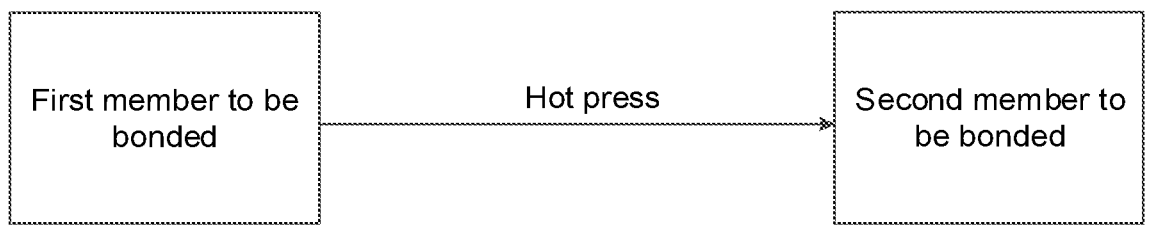

In the related art, referring to FIG. 4A, adjacent components (which may be referred to as a first member to be bonded and a second member to be bonded, and neither of them contains the thermal adhesive film) of a display module 1' are bonded through an optically adhesive layer. For example, the first member to be bonded is the display panel, and the second member to be bonded is a touch structure. As another example, the first member to be bonded includes the display panel and the touch structure bonded to the display panel, and the second member to be bonded is a polarizer. A material of the optically adhesive layer is the optically clear adhesive (OCA). For the sake of a firm bonding, it is necessary to ensure a thickness of the optically clear adhesive, which will affect the overall thickness of the display module, and in the bonding process, two attaching processes are required. Referring to (a) in FIG. 4B, the first attaching process is used to attach the first member to be bonded to the optically clear adhesive, and the second attaching process is used to attach the second member to be bonded to the first member to be bonded to which the optically clear adhesive is attached. The two attaching processes are relatively complicated, and cost manpower and material resources, which will increase the manufacturing cost of the display module.

In the display module provided by some embodiments of the present disclosure, at least one of the first member to be bonded and the second member to be bonded includes the thermal adhesive film, so that the first member to be bonded and the second member to be bonded may be bonded together by hot pressing. As a result, the optically clear adhesive may be omitted, so that the overall thickness of the display module may be reduced. In addition, referring to (b) in FIG. 4B, the bonding between the first member to be bonded and the second member to be bonded may be completed by one hot pressing process, which simplifies the production process compared to two attaching processes using the optically clear adhesive for bonding in the related art.

In some embodiments, referring to FIGS. 5A to 5F, the component 2 to be bonded is a polarizer. The at least one thermal adhesive film 20 includes a first thermal adhesive film 21 disposed on the light exit surface or the back surface of the display panel 10. The layer 200 to be bonded includes a polarizing functional layer 31 disposed on a side of the first thermal adhesive film 21 away from the display panel 10. At least the first thermal adhesive film 21 and the polarizing functional layer 31 constitute a polarizer PF. That is, the first thermal adhesive film 21 and the polarizing functional layer 31 will form an integrated (i.e., not separated from each other) structure with a polarizing function, i.e., the polarizer PF. For example, the first thermal adhesive film 21 and the polarizing functional layer 31 may be in direct contact (e.g., they are pressed together, e.g., they are pressed together by the hot pressing process) to form the integrated structure. As another example, an adhesive layer may be provided between the first thermal adhesive film 21 and the polarizing functional layer 31, and the first thermal adhesive film 21 and the polarizing functional layer 31 are bonded together through the adhesive layer. A material of the adhesive layer may be the pressure sensitive adhesive (PSA) or the optically clear adhesive (OCA).

In some examples, the first thermal adhesive film 21 is bonded to the display panel 10. For example, the polarizer PF including the first thermal adhesive film 21 and the polarizing functional layer 31 may directly adhere to a surface of the display panel 10 using a thermal bonding characteristic of the first thermal adhesive film 21, so as to be fixed on the display panel 10.

In some other examples, the display module 1 includes a plurality of functional layers 30. For example, the plurality of functional layers 30 include the polarizing functional layer 31, and further include at least one functional layer 30x (i.e., one or more functional layers 30x) located between the display panel 10 and the first thermal adhesive film 21 (i.e., located between the display panel 10 and the polarizer PF), such as the touch circuit layer. In this case, the polarizer PF adheres to a functional layer 30x or a base material layer carrying the functional layer 30x adjacent to the polarizer PF, so as to be fixed on the display panel 10. The at least one functional layer 30x located between the display panel 10 and the polarizer PF are shown by the dashed box, which indicates that the at least one functional layers 30x may also not be disposed between the display panel 10 and the polarizer PF.

Figure 5A:
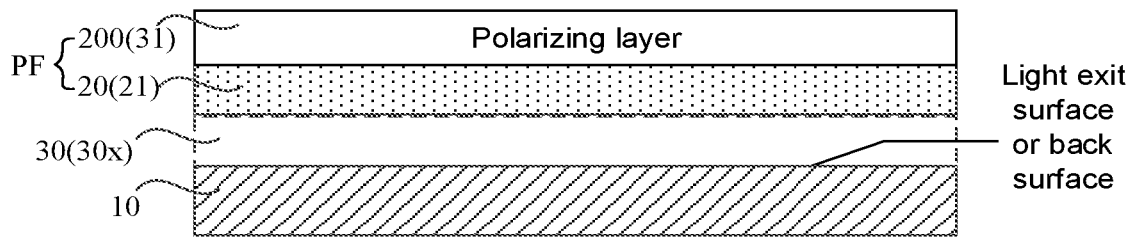
FIG. 5A is a diagram showing a structure of yet another display module, in accordance with some embodiments of the present disclosure.

In some examples, as shown in FIG. 5A, the polarizing functional layer 31 may be a single layer. For example, the polarizing functional layer 31 may be a polarizing layer. A material of the polarizing layer may be, for example, polyvinyl alcohol (PVA). In this case, the polarizer PF including the polarizing layer and the first thermal adhesive film 21 may be a linear polarizer, and is configured to allow linear polarized light parallel with a polarization direction of the linear polarizer to exit.

In some other examples, referring to FIGS. 5B to 5E, the polarizing functional layer 31 is a structure with multiple layers stacked.

Figure 5B:
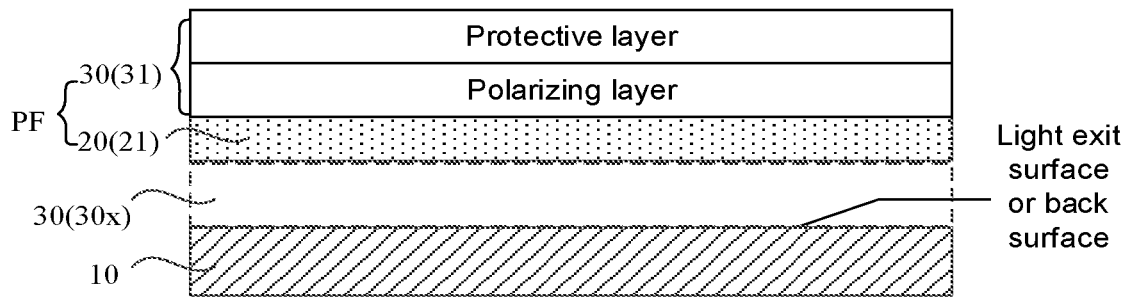
FIG. 5B is a diagram showing a structure of yet another display module, in accordance with some embodiments of the present disclosure.

For example, as shown in FIG. 5B, the polarizing functional layer 31 includes the polarizing layer and a protective layer that are sequentially stacked in a direction away from the display panel 10. A material of the protective layer may be, for example, triacetyl cellulose (TAC), and the material of the polarizing layer may be, for example, polyvinyl alcohol (PVA). In this case, the first thermal adhesive film 21 may play a role of protecting the polarizing layer. The polarizer PF including the polarizing functional layer 31 and the first thermal adhesive film 21 may be the linear polarizer.

Figure 5C:
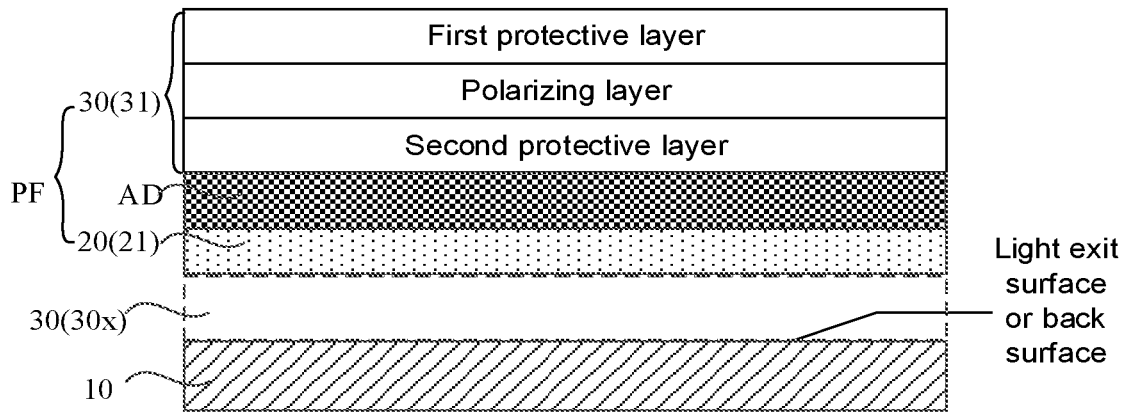
FIG. 5C is a diagram showing a structure of yet another display module, in accordance with some embodiments of the present disclosure.

As another example, as shown in FIG. 5C, the polarizing functional layer 31 includes a first protective layer, the polarizing layer, and a second protective layer that are sequentially stacked in a direction proximate to the display panel 10. Materials of the first protective layer and the second protective layer may be, for example, TAC, and the material of the polarizing layer may be, for example, PVA. In some examples, the polarizing functional layer 31, the first thermal adhesive film 21, and the adhesive layer AD located between the polarizing functional layer 31 and the first thermal adhesive film 21 for bonding them together constitute the polarizer PF. The material of the adhesive layer AD may be the pressure sensitive adhesive or the optically clear adhesive. In some other examples, the first thermal adhesive film 21 and the polarizing functional layer 31 may be in direct contact, for example, they may be pressed (e.g., hot pressed) together.

Figure 5D:
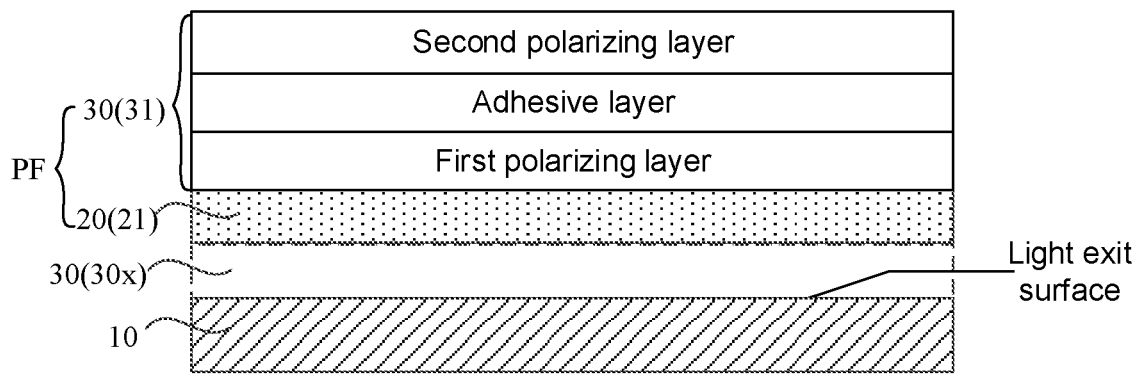
FIG. 5D is a diagram showing a structure of yet another display module, in accordance with some embodiments of the present disclosure.

As another example, as shown in FIG. 5D, the polarizing functional layer 31 on a side where the light exit surface of the display panel 10 is located includes a first polarizing layer, the adhesive layer, and a second polarizing layer that are sequentially stacked in the direction away from the display panel 10. For example, the first polarizing layer and the second polarizing layer may both be linear polarizing layers, and light absorption axes of the two may be parallel or cross. For example, an included angle between the light absorption axes of the two is within a range of 20° to 70°, inclusive, such as 30°, 45°, or 60°. In this way, it is possible to prevent a dazzling problem caused by the reflection of light off a screen. The first polarizing layer and the first thermal adhesive film 21 may be in direct contact, or may be bonded together through the adhesive layer. The material of the polarizing layer (i.e., the first polarizing layer or the second polarizing layer) may be, for example, polyvinyl alcohol (PVA). The material of the adhesive layer may be, for example, the optically clear adhesive or the pressure sensitive adhesive.

Figure 5E:
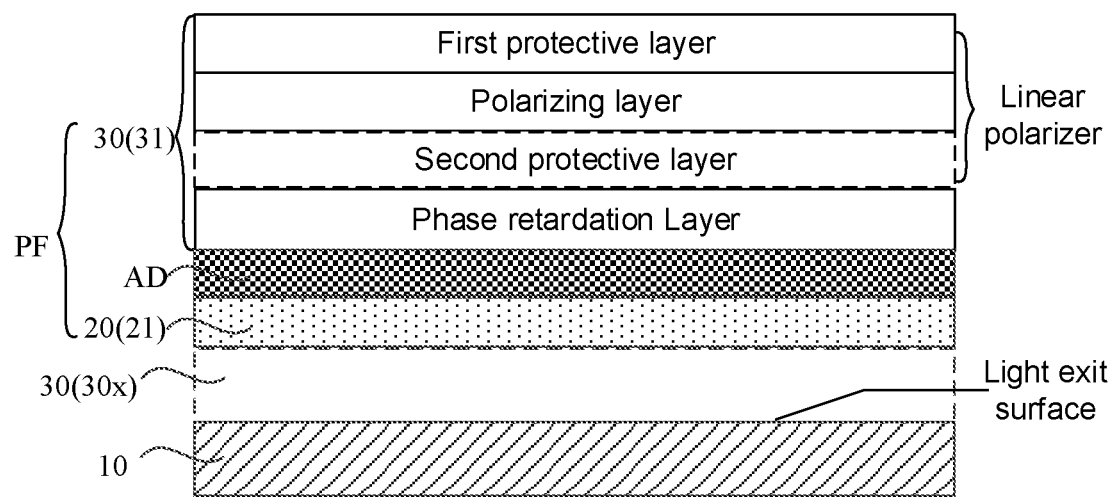
FIG. 5E is a diagram showing a structure of yet another display module, in accordance with some embodiments of the present disclosure.

As another example, as shown in FIG. 5E, the polarizing functional layer 31 includes a linear polarizer and a phase retardation layer (also referred to as a phase retardation film, e.g., a quarter-wave plate) that are sequentially arranged in the direction proximate to the display panel 10, and the linear polarizer and the phase retardation layer may be in direct contact, or may be bonded through the adhesive layer (e.g., the pressure sensitive adhesive) therebetween. In some examples, the linear polarizer may include the first protective layer, the polarizing layer, and the second protective layer that are sequentially stacked. For a material of each of the first protective layer, the polarizing layer, and the second protective layer, reference may be made to the description in the corresponding example in FIG. 5C. In some other examples, the linear polarizer may include the first protective layer and the polarizing layer that are sequentially stacked. In addition, the phase retardation layer may include one liquid crystal layer or a plurality of liquid crystal layers that are sequentially stacked. In addition, the polarizing functional layer 31 may be bonded to the first thermal adhesive film 21 through the adhesive layer AD (e.g., the pressure sensitive adhesive) to constitute the polarizer PF. The polarizing functional layer 31 may also be in direct contact with the first thermal adhesive film 21 to constitute the polarizer PF. The polarizer PF may be a circular polarizer, and is configured to convert incident natural light into circular polarized light.

With continued reference to FIGS. 5D and 5E, the polarizer PF may only be disposed on a side where the light exit surface of the display panel 10 is located. For example, the display panel 10 may be the OLED display panel or a QLED display panel.

Figure 5F:
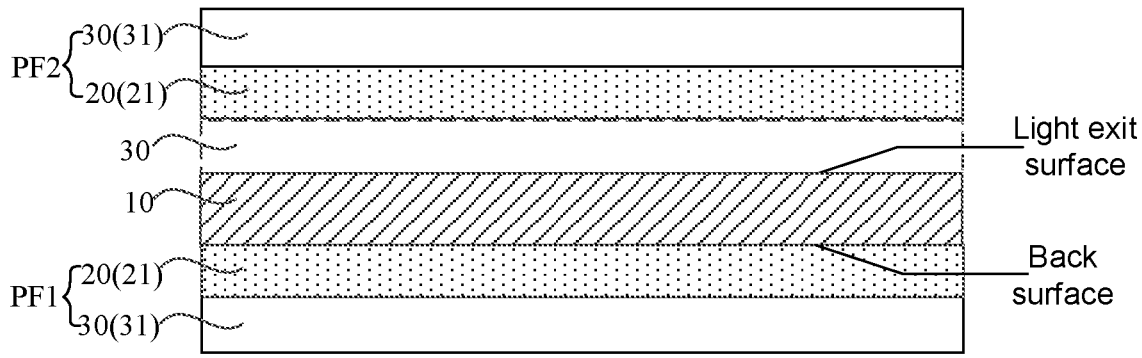
FIG. 5F is a diagram showing a structure of yet another display module, in accordance with some embodiments of the present disclosure.

In some other examples, referring to FIG. 5F, a second polarizer PF2 is disposed on a side where the light exit surface of the display panel 10 is located, and a first polarizer PF1 is disposed on a side where the back surface of the display panel 10 is located. The second polarizer PF2 and the first polarizer PF1 may both include the first thermal adhesive film 21 and the polarizing functional layer 31. For example, the display panel 10 may be the LCD display panel, and the second polarizer PF2 and the first polarizer PF1 may each be a linear polarizer, such as the polarizer PF as shown in any of FIGS. 5A to 5C. Structures of the second polarizer PF2 and the first polarizer PF1 may be the same or different.

In the related art, referring to FIG. 4A, in the display module 1', the polarizer and an adjacent component (e.g., the touch structure or the cover plate) are bonded through the optically adhesive layer. In the embodiments of the present disclosure, referring to FIGS. 5A to 5F, the polarizing functional layer 31 and the first thermal adhesive film 21 are integrated into the polarizer PF. In an aspect, the first thermal adhesive film 21 supports and protects the polarizing functional layer 31. In another aspect, in a case where the polarizer PF needs to be bonded to an adjacent component (e.g., the display panel 10 or the display panel provided with the functional layer), the polarizer PF and the adjacent component may be directly hot pressed and bonded together through the first thermal adhesive film 21 included in the polarizer PF, which omits the optically adhesive layer between the polarizer PF and the adjacent component. Therefore, the functional layers in the display module 1 are integrated, so that the structure of the display module 1 may be simplified, and the thickness of the display module 1 may be reduced. Since the number of attaching processes is reduced, the production process is simplified, which may help to reduce the production cost.

Figure 6:
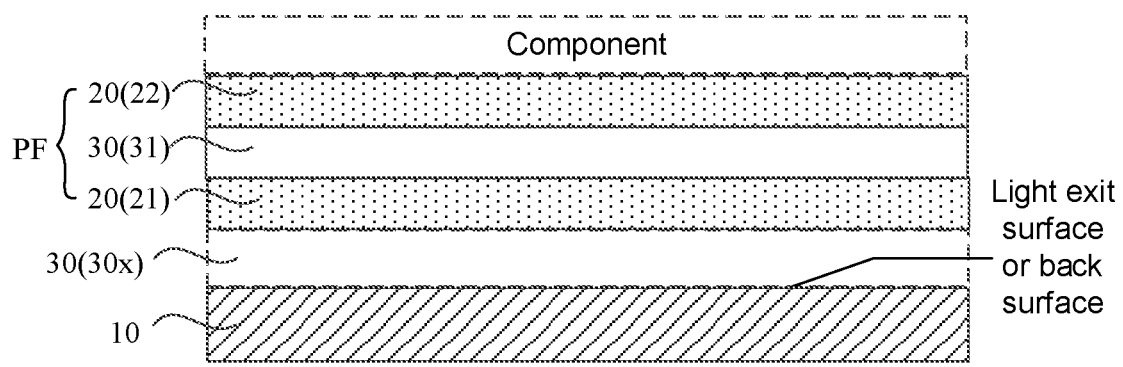
FIG. 6 is a diagram showing a structure of yet another display module, in accordance with some embodiments of the present disclosure.

In some other embodiments, referring to FIG. 6, the at least one thermal adhesive film 20 further includes a second thermal adhesive film 22 disposed on a side of the polarizing functional layer 31 away from the first thermal adhesive film 21. That is, the first thermal adhesive film 21 and the second thermal adhesive film 22 are located on opposite sides of the polarizing functional layer 31. At least the first thermal adhesive film 21, the polarizing functional layer 31, and the second thermal adhesive film 22 constitute the polarizer PF. That is, the first thermal adhesive film 21, the polarizing functional layer 31, and the second thermal adhesive film 22 form an integrated and inseparable structure with a polarizing function, i.e., a polarizer PF.

For the composition of the polarizing functional layer 31, and the relative position relationship and the connection relationship between the polarizer PF and the display panel 10, reference may be made to the description in the corresponding example in any of FIGS. 5A to 5F, which will not be repeated herein. In addition, for the connection relationship between the second thermal adhesive film 22 and the polarizing functional layer 31, reference may be similarly made to the connection relationship between the first thermal adhesive film 21 and the polarizing functional layer 31 in the corresponding example in any of FIGS. 5A to 5F, which will not be repeated herein.

For example, the display module 1 may further include a component located on a side of the second thermal adhesive film 22 away from the display panel 10 and bonded to the second thermal adhesive film 22. For example, the component and the polarizer PF including the second thermal adhesive film 22 may be hot pressed together. The component may include other functional layers. For example, the polarizer PF may be disposed on the light exit surface of the display panel 10, and the component may be any functional layer of the cover plate, the touch circuit layer, etc. disposed on the light exit surface of the display panel 10. As another example, the component may be a heat radiating plate disposed on the back surface of the display panel 10. In addition, the component may include another functional layer and a base material layer carrying the another functional layer. In an example, the component includes the touch circuit layer and a base material layer carrying the touch circuit layer. For example, the base material layer is closer to the second thermal adhesive film 22 than the touch circuit layer, and the base material layer and the second thermal adhesive film 22 may be hot pressed together. As another example, the base material layer is farther away from the second thermal adhesive film 22 than the touch circuit layer, the component including the touch circuit layer and the base material layer may be hot pressed together with the second thermal adhesive film 22, and may also be bonded to the second thermal adhesive film 22 through the adhesive layer.

Figure 7:
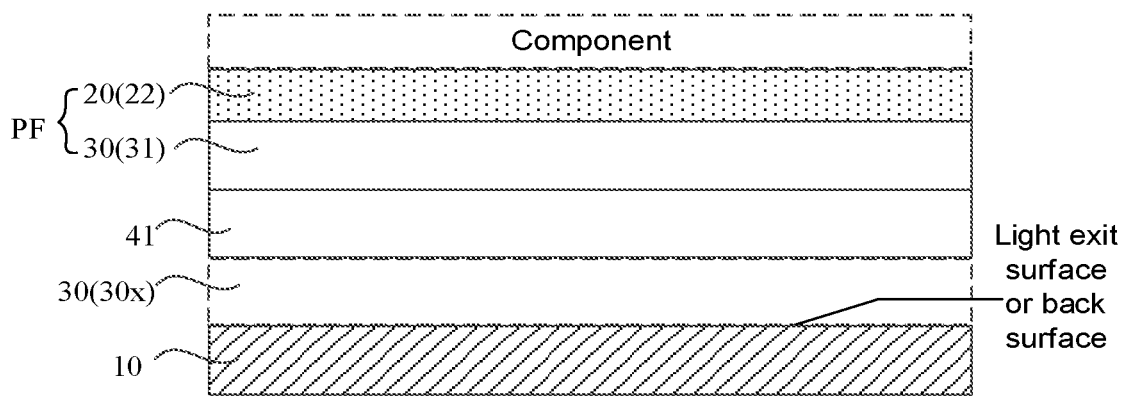
FIG. 7 is a diagram showing a structure of yet another display module, in accordance with some embodiments of the present disclosure.

In yet other embodiments, referring to FIG. 7, the display module 1 includes the display panel 10 and the component 2 to be bonded. The component 2 to be bonded is a polarizer. The at least one thermal adhesive film 20 in the component 2 to be bonded includes the second thermal adhesive film 22 disposed on the light exit surface or the back surface of the display panel 10. The layer 200 to be bonded in the component 2 is the polarizing functional layer 31 disposed on a side of the second thermal adhesive film 22 proximate to the display panel 10. The display module 1 further includes a first adhesive layer 41 disposed on a side of the polarizing functional layer 31 proximate to the display panel 10. At least the second thermal adhesive film 22 and the polarizing functional layer 31 constitute the polarizer PF. That is, the polarizing functional layer 31 and the second thermal adhesive film 22 form an integrated and inseparable structure with the polarizing function, i.e., the polarizer PF.

For the composition of the polarizing functional layer 31 and the relative positional relationship between the polarizer PF and the display panel 10, reference may be made to the description in the corresponding example in any of FIGS. 5A to 5F, which will not be repeated herein. In addition, for the connection relationship between the second thermal adhesive film 22 and the polarizing functional layer 31, reference may be similarly made to the connection relationship between the first thermal adhesive film 21 and the polarizing functional layer 31 in the corresponding example in any of FIGS. 5A to 5F, which will not be repeated herein.

For example, the display module 1 may further include the component located on the side of the second thermal adhesive film 22 away from the display panel 10 and bonded to the second thermal adhesive film 22. For example, the component and the polarizer PF including the second thermal adhesive film 22 may be hot pressed together. For the composition of the component and the connection relationship between the component and the second thermal adhesive film 22, reference may be made to the description in the corresponding example in FIG. 6, which will not be repeated herein.

In some examples, the polarizer PF is bonded to the display panel 10 through the first adhesive layer 41. In some other embodiments, the display module 1 may further include at least one functional layer 30x (i.e., one or more functional layers 30x) disposed between the display panel 10 and the first adhesive layer 41. The first adhesive layer 41 bonds the polarizer PF onto a functional layer 30x (i.e., one of the at least one functional layer 30x that is closest to the polarizer PF), or bonds the polarizer PF onto a base material layer carrying the functional layer 30x. For example, the functional layer 30x may be the touch circuit layer. The touch circuit layer uses the display panel 10 as a substrate and is directly formed on the light exit surface of the display panel 10. In this case, the polarizer PF may be bonded to the display panel 10 provided with the touch circuit layer through the first adhesive layer 41. As another example, the functional layer 30x may be the touch circuit layer. The touch circuit layer is formed on a base material layer, and the base material layer is farther away from the display panel 10 than the touch circuit layer. In this case, the polarizer PF may be bonded to the base material layer carrying the touch circuit layer through the first adhesive layer 41.

For example, the first adhesive layer 41 is the optically clear adhesive or the pressure sensitive adhesive.

Figure 8A:
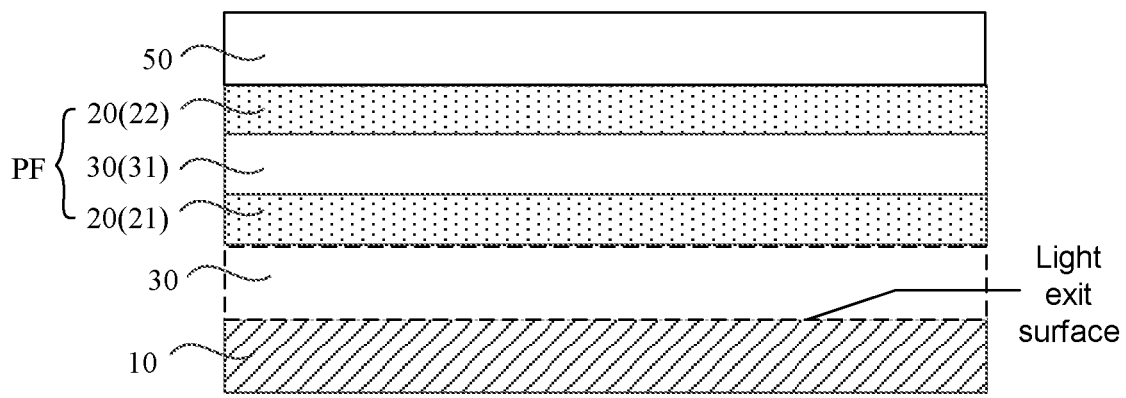
FIG. 8A is a diagram showing a structure of yet another display module, in accordance with some embodiments of the present disclosure.
Figure 8B:
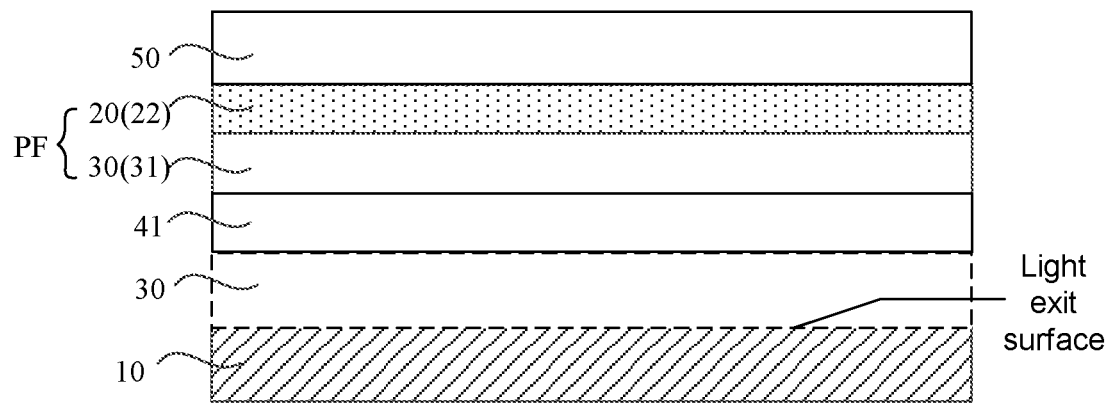
FIG. 8B is a diagram showing a structure of yet another display module, in accordance with some embodiments of the present disclosure.

In some embodiments, referring to FIGS. 8A and 8B, the polarizer PF is disposed on the light exit surface of the display panel 10. In FIG. 8A, for the composition of the polarizer PF and the connection relationship between the polarizer PF and the display panel 10, reference may be made to the description in the corresponding example in FIG. 6. In FIG. 8B, for the composition of the polarizer PF and the connection relationship between the polarizer PF and the display panel 10, reference may be made to the description in the corresponding example in FIG. 7.

The display module 1 further includes a cover plate 50 disposed on a side of the polarizer PF away from the display panel 10 (i.e., the side of the second thermal adhesive film 22 away from the display panel 10). A material of the cover plate 50 is a transparent material. For example, the material of the cover plate 50 may be glass, or polymethyl methacrylate (PMMA), etc. The cover plate 50 may isolate and protect the display panel 10. The cover plate 50 may be a planar structure, or may have curved edges bent toward the display panel 10 on opposite sides thereof, so as to meet the requirement for a curved display module.

The cover plate 50 is bonded to the display panel 10 through the second thermal adhesive film 22, that is, the polarizer PF including the second thermal adhesive film 22 is bonded to the cover plate 50. For example, the cover plate 50 may be bonded to the second thermal adhesive film 22 by the hot pressing process. That is, in this case, the cover plate 50 and the second thermal adhesive film 22 are in direct contact, and there is no need to provide the adhesive layer therebetween.

Similar to the first thermal adhesive film 21, in embodiments of the present disclosure including the second thermal adhesive film 22, in an aspect, the second thermal adhesive film 22 may play a role of supporting and protecting the polarizing functional layer 31; and in another aspect, in a case where the polarizer PF needs to be bonded to the adjacent component (e.g., the cover plate), the polarizer PF and the adjacent component may be directly hot pressed and bonded together through the second thermal adhesive film 22 included in the polarizer PF. As a result, the functional layers are integrated, the thickness of the display module 1 may be reduced, and the production process of the display module 1 may be simplified simultaneously.

Figure 9A:
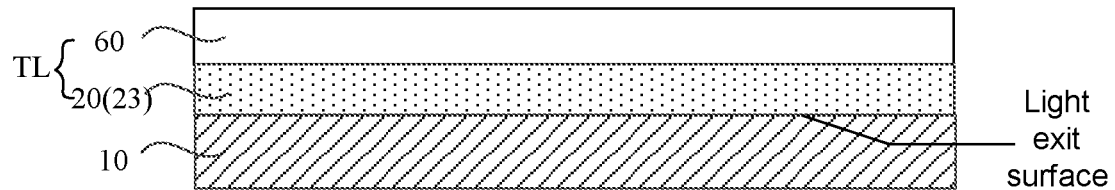
FIG. 9A is a diagram showing a structure of yet another display module, in accordance with some embodiments of the present disclosure.

In some embodiments, referring to FIG. 9A, the component 2 to be bonded is a touch structure TL. The at least one thermal adhesive film 20 includes a third thermal adhesive film 23 disposed on the light exit surface of the display panel 10. The layer 200 to be bonded includes the touch circuit layer 60 disposed on a side of the third thermal adhesive film 23 away from the display panel 10. At least the third thermal adhesive film 23 and the touch circuit layer 60 constitute a touch structure TL. That is, the touch circuit layer 60 and the third thermal adhesive film 23 are formed an integrated and inseparable structure with a touch function, i.e., the touch structure TL. In this case, there is no need to provide a touch circuit layer inside the display panel 10.

In some examples, the third thermal adhesive film 23 is bonded to the display panel 10. For example, the third thermal adhesive film 23 and the display panel 10 are bonded together by a hot pressing process. In some other examples, other functional layers may be provided between the touch structure TL and the display panel 10. The third thermal adhesive film 23 in the touch structure TL may be bonded to a functional layer among these functional layers that is closest to the third thermal adhesive film 23 by hot pressing.

The third thermal adhesive film 23 may achieve effects similar to effects achieved by the first thermal adhesive film, which will not be repeated herein.

Figure 9B:
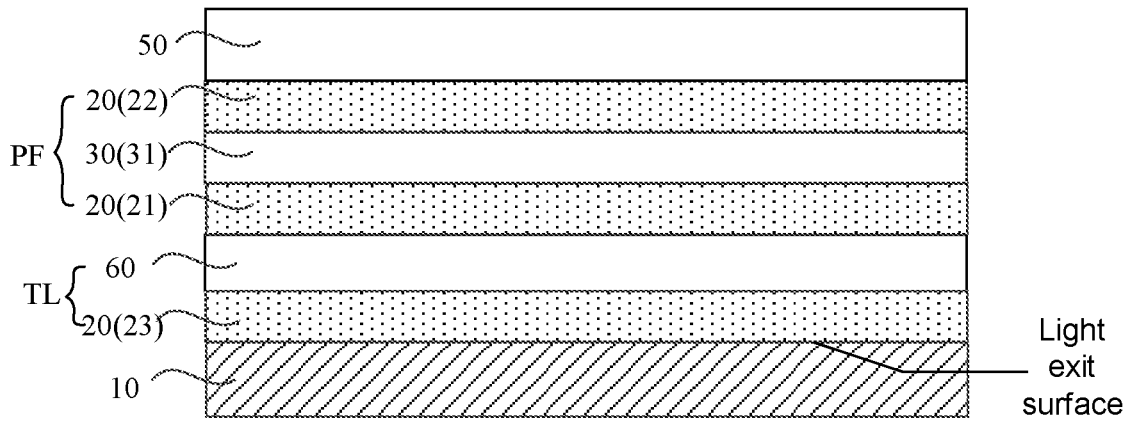
FIG. 9B is a diagram showing a structure of yet another display module, in accordance with some embodiments of the present disclosure.
Figure 9C:
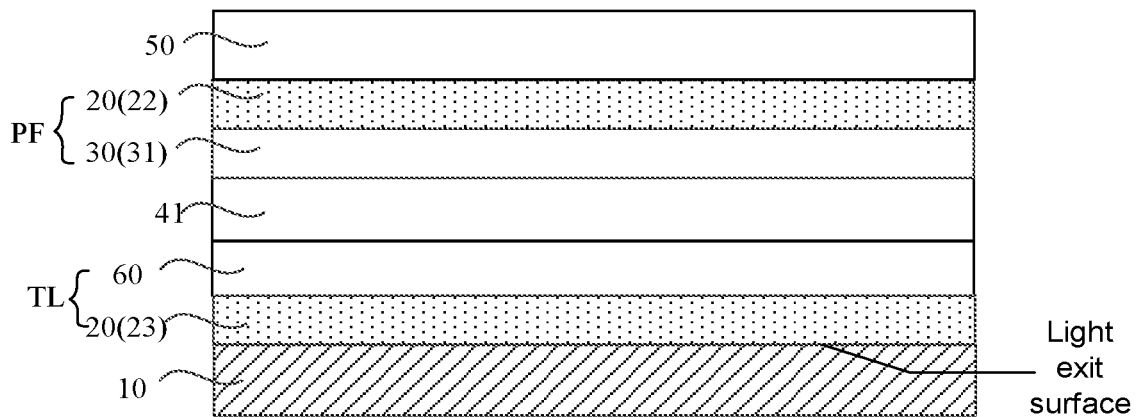
FIG. 9C is a diagram showing a structure of yet another display module, in accordance with some embodiments of the present disclosure.

In some other embodiments, as shown in FIGS. 9B and 9C, the display module 1 includes the display panel 10, the polarizer PF disposed on the light exit surface of the display panel 10, and the touch structure TL disposed between the polarizer PF and the display panel 10. The polarizer PF is bonded to the touch structure TL. For the composition of the touch structure TL and the connection relationship between the touch structure TL and the display panel 10, reference may be made to the description in the corresponding example in FIG. 9A. For the composition of the polarizer PF and the connection relationship between the polarizer PF and adjacent components, reference may be made to the descriptions of the above embodiments. For example, referring to FIG. 9B, the polarizer PF includes the first thermal adhesive film 21 and the polarizing functional layer 31 that are sequentially stacked in the direction away from the display panel 10, and may further include the second thermal adhesive film 22. The polarizer PF is bonded to the touch structure TL through the first thermal adhesive film 21 located in the polarizer PF by hot pressing or through the adhesive layer. As another example, referring to FIG. 9C, the polarizer PF includes the polarizing functional layer 31 and the second thermal adhesive film 22 that are sequentially stacked in the direction away from the display panel 10. The polarizer PF is bonded to the touch structure TL through the first adhesive layer 41. In addition, in FIGS. 9B and 9C, the second thermal adhesive film 22 and the cover plate 50 may be bonded together by hot pressing.

It will be noted that, in FIGS. 9A, 9B, and 9C, the display panel 1 may be the OLED display panel or the QLED display panel. The third thermal adhesive film 23 of the touch structure TL is bonded to an encapsulation layer of the OLED display panel by the hot pressing process. The display panel 1 may also be the LCD display panel, and the third thermal adhesive film 23 of the touch structure TL is bonded to a base of the LCD display panel (e.g., the second base 151 in FIG. 3B) by the hot pressing process.

In the display module 1 provided by the embodiments of the present disclosure, the third thermal adhesive film 23 is used as the base material layer carrying the touch circuit layer 60 in the touch structure TL, which may also achieve effects of reducing the thickness of the display module 1 and simplifying the production process.

Figure 10A:
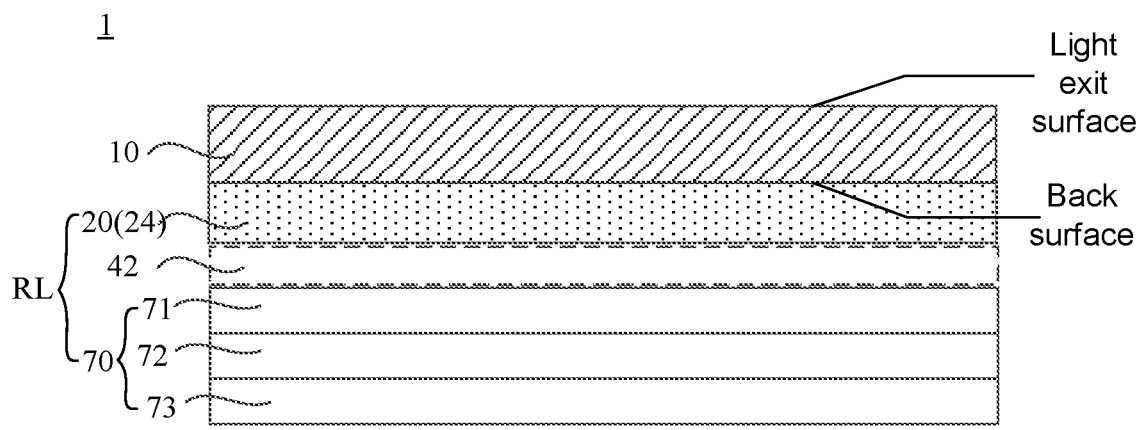
FIG. 10A is a diagram showing a structure of yet another display module, in accordance with some embodiments of the present disclosure.

In some embodiments, referring to FIG. 10A, the component 2 to be bonded is a heat radiating structure RL. The at least one thermal adhesive film 20 in the display module 1 includes a fourth thermal adhesive film 24. The fourth thermal adhesive film 24 is disposed on the back surface of the display panel 10 and bonded to the display panel 10. For example, the fourth thermal adhesive film 24 may be bonded to the base in the display panel 10 by hot pressing.

The fourth thermal adhesive film 24 in the display module 1 provided by the embodiments of the present disclosure may be used as the back film of the display panel 1 to replace a combination of the back film and the optically clear adhesive in the display module 1' in the related art (shown in FIG. 4A), which may also achieve the effects of reducing the thickness of the display module 1 and simplifying the production process.

In some other embodiments, with continued reference to FIG. 10A, the layer 200 to be bonded includes a heat radiating plate (also referred to as a support structure) 70 disposed on a side of the fourth thermal adhesive film 24 away from the display panel 10. The heat radiating plate 70 may include a buffer layer 71, a support layer 72, and a heat radiating layer 73 that are sequentially stacked. For example, the buffer layer 71 has an effect of resistance to compression and a buffer function on the display module 1 to prevent an external force from damaging the display module 1. For example, the buffer layer 71 may be a foam, or a silicone cushion, etc. The heat radiating layer 73 is used to timely conduct away heat generated by the display module 1 (mainly by the display panel 10 in the display module 1) to avoid poor display due to a fact that the display module 1 is overheated. For example, the heat radiating layer 73 may be a graphite sheet, or copper foil, etc. The support layer 72 may be conductive fabric, etc.

The buffer layer 71 is bonded to the fourth thermal adhesive film 24. For example, the buffer layer 71 and the fourth thermal adhesive film 24 are bonded together by hot pressing, and they are in direct contact. Or, the display module 1 further includes a second adhesive layer 42, and the buffer layer 71 is bonded to the fourth thermal adhesive film 24 through the second adhesive layer 42. For example, the second adhesive layer 42 is the optically clear adhesive or the pressure sensitive adhesive.

Figure 10B:
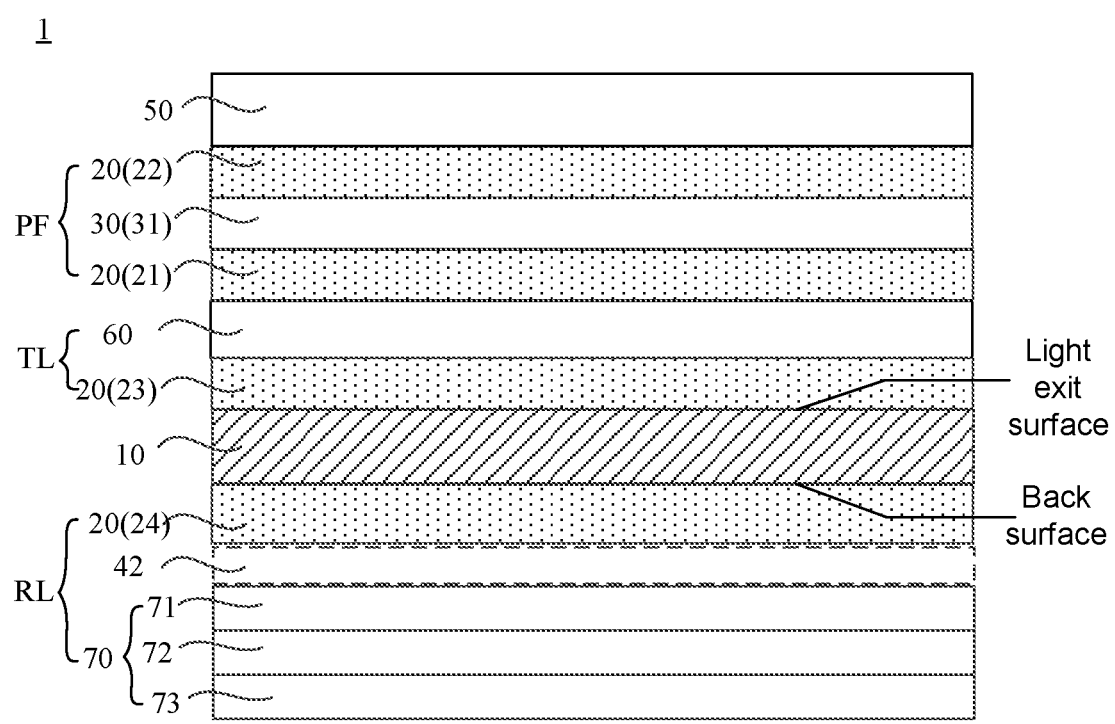
FIG. 10B is a diagram showing a structure of yet another display module, in accordance with some embodiments of the present disclosure.

In yet other embodiments, referring to FIG. 10B, for the back surface of the display panel 10, reference may be made to the description in the corresponding example in FIG. 10A. At least one of the first thermal adhesive film 21, the second thermal adhesive film 22, and the third thermal adhesive film 23 may be disposed on the side where the light exit surface of the display panel 10 is located. For details, reference may be made to the description in the corresponding example in any of FIGS. 5A to 9C.

In the above embodiments, a thermal adhesive film 20 (including any of the first thermal adhesive film 21, the second thermal adhesive film 22, the third thermal adhesive film 23, and the fourth thermal adhesive film 24) is made of polyamide, thermoplastic polyurethane (TPU), polyester fiber, polyolefin, cycloolefin copolymer (COC) or cycloolefin polymer (COP). These materials all have the advantages of low cost, good thermal strength and thermal ductility.

In addition, a thickness of a thermal adhesive film 20 (including any of the first thermal adhesive film 21, the second thermal adhesive film 22, the third thermal adhesive film 23, and the fourth thermal adhesive film 24) is within a range of 10 μm to 150 μm, inclusive, for example, it may be 70 μm, 75 μm, and 90 μm, thereby helping to reduce the thickness of the display module.

The embodiments of the present disclosure provide a polarizer for a display module. Referring to FIGS. 5A to 7, the polarizer PF for the display module includes the polarizing functional layer 31. The polarizing functional layer 31 has a first surface and a second surface in a thickness direction thereof. The first surface is a surface facing toward the display panel 10, and the second surface is a surface facing away from the display panel 10.

The polarizer PF for the display module further includes at least one of the first thermal adhesive film 21 and the second thermal adhesive film 22, i.e., the first thermal adhesive film 21, the second thermal adhesive film 22, or both the first thermal adhesive film 21 and the second thermal adhesive film 22. Taking an example in which the polarizer PF includes the first thermal adhesive film 21 and the second thermal adhesive film 22, the first thermal adhesive film 21 is fixed to the first surface of the polarizing functional layer 31, and the second thermal adhesive film 22 is fixed to the second surface of the polarizing functional layer 31. For example, referring to FIGS. 5A to 5F, the polarizer PF for the display module includes the first thermal adhesive film 21 and the polarizing functional layer 31. As another example, referring to FIG. 6, the polarizer PF for the display module includes the first thermal adhesive film 21, the polarizing functional layer 31, and the second thermal adhesive film 22. As another example, referring to FIG. 7, the polarizer PF for the display module includes the polarizing functional layer 31 and the second thermal adhesive film 22.

The polarizer for the display module can also achieve the effects of reducing the thickness of the display module 1 and simplifying the production process.

Figure 11:
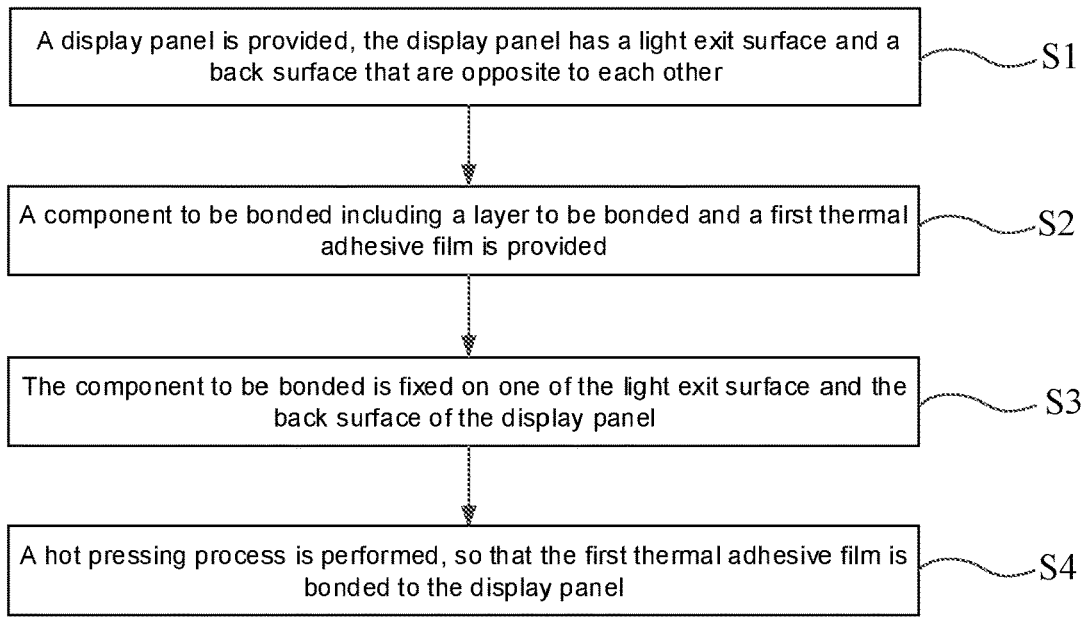
FIG. 11 is a flow diagram of a method of manufacturing a display module, in accordance with some embodiments of the present disclosure.

The embodiments of the present disclosure further provide a method of manufacturing a display module. The display module is the display module provided in any of the above embodiments, and for its structure, reference may be made to the introduction of the display module in any of the above embodiments. Referring to FIG. 11, the method of manufacturing the display module includes steps 1 to 4 (S1 to S4).

In S1, a display panel is provided, the display panel has a light exit surface and a back surface that are opposite to each other.

In S2, a component to be bonded including a layer to be bonded and a first thermal adhesive film is provided.

In S3, the component to be bonded is fixed on one of the light exit surface and the back surface of the display panel. The first thermal adhesive film is closer to the display panel than the layer to be bonded.

In S4, a hot pressing process is performed, so that the first thermal adhesive film is bonded to the display panel.

In some embodiments, the component to be bonded includes the layer to be bonded, the first thermal adhesive film and a second thermal adhesive film. The first thermal adhesive film is closer to the display panel than the layer to be bonded, and the second thermal adhesive film is farther away from the display panel than the layer to be bonded.

For example, a polarizer is provided, the polarizer includes a polarizing functional layer that has a first surface and a second surface in a thickness direction of the polarizing functional layer, and the polarizer further includes a first thermal adhesive film and a second thermal adhesive film respectively disposed on the first surface and the second surface of the polarizing functional layer.

On this basis, the polarizer is fixed on the light exit surface of the display panel. The first thermal adhesive film is closer to the display panel than the polarizing functional layer. The second thermal adhesive film is farther away from the display panel than the polarizing functional layer.

Before S4, the method of manufacturing the display module further includes step 5 (S5).

In S5, a cover plate is fixed on the second thermal adhesive film, so that the cover plate is bonded to the second thermal adhesive film during the hot pressing process.

It should be noted that, the component to be bonded in the display module may include the first thermal adhesive film, or may include the second thermal adhesive film, or may include both the first thermal adhesive film and the second thermal adhesive film. The embodiments of the present disclosure do not limit this, and it can be set according to actual needs.

Figure 12:
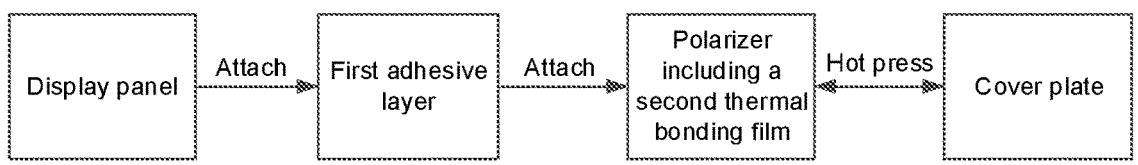
FIG. 12 shows flow diagrams of some methods of manufacturing a display module, in accordance with some embodiments of the present disclosure.
Figure 12:
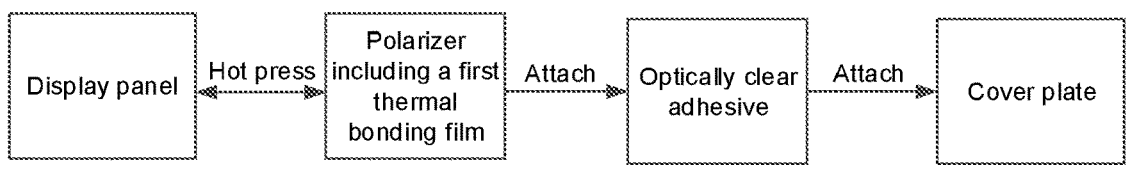
Figure 12:
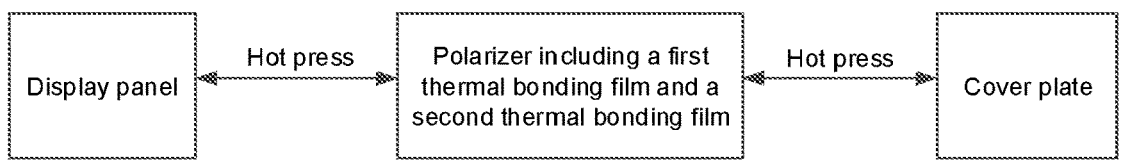

As shown in (a) in FIG. 12, in a example, a process of manufacturing the display module provided by the embodiments of the present disclosure includes the following steps.

First, a display panel is provided. The display panel includes a light exit surface and a back surface that are disposed oppositely. The display panel is, for example, an OLED display panel. For example, a touch circuit layer may be disposed on the light exit surface of the OLED display panel.

Then, a polarizer including a second thermal adhesive film is provided, and at room temperature, the polarizer and the touch circuit layer are bonded through a first adhesive layer. The first adhesive layer bonds the polarizer to the touch circuit layer.

After that, a cover plate is placed on the second thermal adhesive film in the polarizer, and the polarizer and the cover plate are hot pressed at a predetermined operating temperature and pressure.

As shown in (b) in FIG. 12, in another example, the process of manufacturing the display module provided by the embodiments of the present disclosure includes the following steps.

First, a display panel is provided. The display panel includes a light exit surface and a back surface that are disposed oppositely.

Then, a polarizer including a first thermal adhesive film is provided. The polarizer is placed on the light exit surface of the display panel. The first thermal adhesive film in the polarizer is in contact with the display panel, and the polarizer and the display panel are hot pressed at a predetermined operating temperature and pressure.

After that, at room temperature, the polarizer is bonded to a cover plate through an adhesive layer such as optically clear adhesive.

As shown in (c) in FIG. 12, in yet another example, the process of manufacturing the display module provided by the embodiments of the present disclosure includes the following steps.

First, a display panel is provided. The display panel includes a light exit surface and a back surface that are disposed oppositely.

Then, a polarizer including a first thermal adhesive film and a second thermal adhesive film is provided. The polarizer further includes a polarizing functional layer between the first thermal adhesive film and the second thermal adhesive film.

After that, the polarizer is placed on the light exit surface of the display panel, and the first thermal adhesive film in the polarizer is in contact with the display panel. A cover plate is placed on the polarizer, and the cover plate is in contact with the second thermal adhesive film in the polarizer. The cover plate, the polarizer, and the display panel are hot pressed at a predetermined operating temperature and pressure.

In some embodiments, when the display module provided by the embodiments of the present disclosure is manufactured, in a process of performing hot pressing to bond the polarizer to the cover plate and/or bond the polarizer to the display panel, the predetermined operating temperature and the pressure are that: the temperature is within a range of 60° C. to 300° C., inclusive, and the pressure is within a range of 0.1 MPa to 20 MPa, inclusive, or 0.1 MPa to 40 MPa, inclusive. In this way, it may be possible to prevent the hot pressing process from damaging film materials of other layers in the display module while achieving a hot pressing environment of the thermal adhesive film.

It will be noted that, the selection of setting values of the operating temperature and the pressure will be based on the materials of the thermal adhesive films. In addition, since time for the hot pressing molding process is relatively short, an effect of a short high-temperature and high-pressure environment on other film materials of the display module is relatively small, or even negligible.

Figure 13:
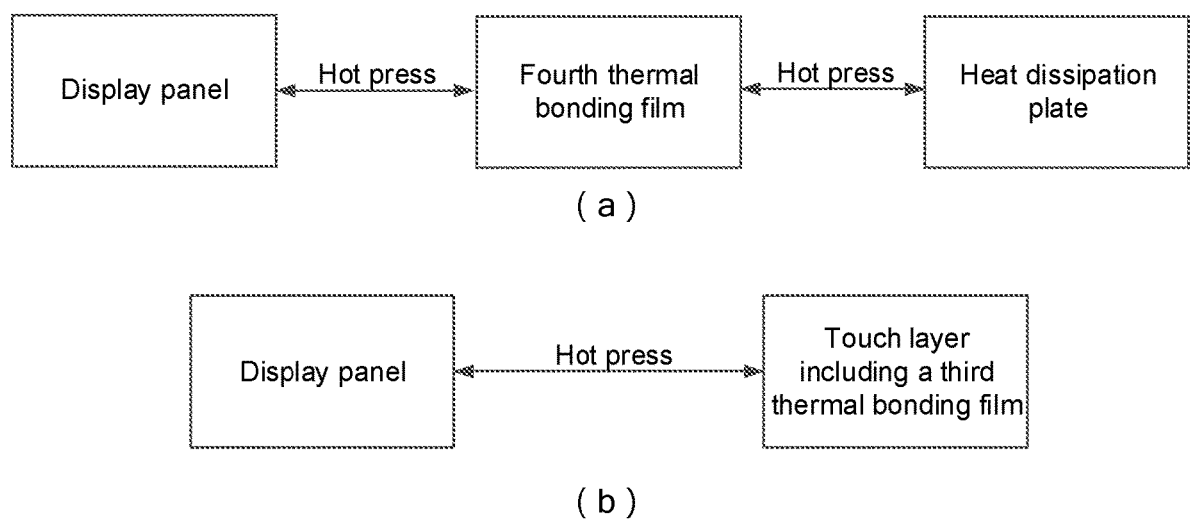
FIG. 13 shows flow diagrams of some other methods of manufacturing a display module, in accordance with some embodiments of the present disclosure.

In addition, as shown in (a) in FIG. 13, in a example, the process of manufacturing the display module provided by the embodiments of the present disclosure may also include the following steps.

First, a display panel is provided. The display panel includes a light exit surface and a back surface that are disposed oppositely.

Then, a fourth thermal adhesive film and a heat radiating plate are sequentially stacked on the back surface of the display panel, and at a predetermined operating temperature and pressure, the display panel, the fourth thermal adhesive film, and the heat radiating plate are hot pressed together.

When the display module provided in the above embodiment is manufactured, the predetermined operating temperature and the pressure for hot pressing (bonding) the display panel including the fourth thermal adhesive film and the heat radiating plate are that: the temperature is within a range of 60° C. to 300° C., inclusive, and the pressure is within a range of 0.1 MPa to 20 MPa, inclusive, or 0.1 MPa to 40 MPa, inclusive.

As shown in (b) in FIG. 13, in another example, the process of manufacturing the display module provided by the embodiments of the present disclosure may also include the following steps.

First, a display panel is provided. The display panel includes a light exit surface and a back surface that are disposed oppositely.

Then, a touch structure including a third thermal adhesive film is provided.

After that, the touch structure is placed on the light exit surface of the display panel. The third thermal adhesive film in the touch structure is in contact with the display panel. The touch structure and the display panel are hot pressed at a predetermined operating temperature and pressure.

When the OLED display module provided by the embodiment is manufactured, the predetermined operating temperature and the pressure for hot pressing (bonding) the touch structure and the display panel are that: the temperature is within a range of 60° C. to 300° C., inclusive, and the pressure is within a range of 0.1 MPa to 20 MPa, inclusive, or 0.1 MPa to 40 MPa, inclusive.

The method of manufacturing the display module can also achieve the same effects of reducing the thickness of the display module and simplifying the production process.

It will be noted that, any of the above solutions or a combination of any several solutions all belongs to a same inventive concept, and all fall within a scope of the embodiments of the present disclosure.

In addition, in the process of forming the display module provided by the embodiments of the present disclosure, if multiple hot pressing processes are included, the multiple hot pressing processes may be completed simultaneously. That is, the bonding of a plurality of layers is completed by one hot pressing process, thereby simplifying the production process of the display module and improving the production efficiency of the display module.

However, the above embodiments of this disclosure are merely examples to clearly illustrate this disclosure, and are not intended to limit the implementations of this disclosure. For those of ordinary skill in the art, other different forms of changes or alterations may be made on a basis of the above description, and all embodiments cannot be exhaustively listed herein. Any obvious changes or alterations derived from the technical solutions of this disclosure are still within the protection scope of this disclosure.

The foregoing descriptions are merely specific implementation manners of the present disclosure, but the protection scope of the present disclosure is not limited thereto. Any changes or replacements that a person skilled in the art could conceive of within the technical scope of the present disclosure shall be included in the protection scope of the present disclosure. Therefore, the protection scope of the present disclosure shall be subject to the protection scope of the claims.

What is claimed is:

1. A display module, comprising:
a display panel having a light exit surface and a back surface that are opposite to each other;
an adhesive layer;
at least one thermal adhesive film, the at least one thermal adhesive film being fixed to one of the light exit surface and the back surface of the display panel through the adhesive layer; and
a layer to be bonded being fixed to the at least one thermal adhesive film;
wherein the at least one thermal adhesive film includes a third thermal adhesive film disposed on the light exit surface of the display panel, the third thermal adhesive film is bonded to the display panel through the adhesive layer;
the layer to be bonded includes a touch circuit layer disposed on a side of the third thermal adhesive film away from the display panel;
the at least one thermal adhesive film includes a fourth thermal adhesive film disposed on the back surface of the display panel, the fourth thermal adhesive film is bonded to the display panel through the adhesive layer;
the layer to be bonded includes a heat radiating plate disposed on a side of the fourth thermal adhesive film away from the display panel; and
the heat radiating plate includes a buffer layer, a support layer, and a heat radiating layer that are sequentially stacked,
wherein the buffer layer is bonded to the fourth thermal adhesive film, or the buffer layer is bonded to the fourth thermal adhesive film through another adhesive layer; and
the buffer layer includes a foam or a silicone cushion, the support layer includes a conductive fabric, and the heat radiating layer includes a graphite sheet, or a copper foil.

2. The display module according to claim 1, wherein the at least one thermal adhesive film includes a first thermal adhesive film, the first thermal adhesive film is bonded to the display panel through the adhesive layer; and
the layer to be bonded includes a polarizing functional layer disposed on a side of the first thermal adhesive film away from the display panel.

3. The display module according to claim 2, wherein the at least one thermal adhesive film further includes a second thermal adhesive film disposed on a side of the polarizing functional layer away from the first thermal adhesive film; wherein the first thermal adhesive film, the polarizing functional layer and the second thermal adhesive film constitute a polarizer.

4. The display module according to claim 3, wherein the polarizer is disposed on the light exit surface of the display panel; and
the display module further includes a cover plate disposed on a side of the polarizer away from the display panel, and the cover plate is bonded to the display panel through the second thermal adhesive film.

5. The display module according to claim 1, wherein any of the at least one thermal adhesive film is made of polyamide, polyurethane, polyester fiber, polyolefin, cycloolefin copolymer or cycloolefin polymer.

6. The display module according to claim 1, wherein a thickness of any of the at least one thermal adhesive film is within a range of 10 μm to 150 μm, inclusive.

7. A display apparatus, comprising the display module according to claim 1.

8. A method of manufacturing a display module, the method comprising:
- providing a display panel, the display panel having a light exit surface and a back surface that are opposite to each other;
- providing a first thermal adhesive film, and fixing the first thermal adhesive film on one of the light exit surface and the back surface of the display panel through an adhesive layer;
- fixing a layer to be bonded on the first thermal adhesive film;
- providing a touch structure including a third thermal adhesive film, wherein the touch structure is placed on the light exit surface of the display panel, and the third thermal adhesive film in the touch structure is in contact with the display panel;
- providing a fourth thermal adhesive film and a heat radiating plate sequentially stacked on the back surface of the display panel; and
- performing a hot pressing process, so that the first thermal adhesive film is bonded to the layer to be bonded, and the touch structure, the third thermal adhesive film, the display panel, the fourth thermal adhesive film, and the heat radiating plate are hot pressed together;

wherein the heat radiating plate includes a buffer layer, a support layer, and a heat radiating layer that are sequentially stacked, wherein
- the buffer layer is bonded to the fourth thermal adhesive film, or
- the buffer layer is bonded to the fourth thermal adhesive film through another adhesive layer; and
- the buffer layer includes a foam or a silicone cushion, the support layer includes a conductive fabric, and the heat radiating layer includes a graphite sheet, or a copper foil.

9. The method according to claim 8, further comprising:
- providing a second thermal adhesive film, the second thermal adhesive film is farther away from the display panel than the layer to be bonded; and
- fixing a cover plate on the second thermal adhesive film, so that the cover plate is bonded to the second thermal adhesive film during the hot pressing process.

10. The method according to claim 8, wherein an operating temperature of the hot pressing process is within a range of 60° C. to 300° C., inclusive; and pressure of the hot pressing process is within a range of 0.1 MPa to 20 MPa, inclusive, or a range of 0.1 MPa to 40 MPa, inclusive.

* * * * *